US010276761B2

(12) United States Patent
Huang et al.

(10) Patent No.: US 10,276,761 B2
(45) Date of Patent: Apr. 30, 2019

(54) PHOTOELECTRIC DEVICE PACKAGE

(71) Applicants: Industrial Technology Research Institute, Hsinchu (TW); Intellectual Property Innovation Corporation, Hsinchu (TW)

(72) Inventors: Yi-Hsiang Huang, Changhua (TW); Cheng-Chung Lee, Hsinchu (TW); Jia-Chong Ho, Hsinchu (TW); Wei-Han Chen, Taipei (TW); Shin-Hong Kuo, New Taipei (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/951,195

(22) Filed: Apr. 12, 2018

(65) Prior Publication Data
US 2018/0351056 A1 Dec. 6, 2018

Related U.S. Application Data

(60) Provisional application No. 62/516,057, filed on Jun. 6, 2017.

(30) Foreign Application Priority Data

Dec. 27, 2017 (TW) .............................. 106145934 A

(51) Int. Cl.
*H01L 27/15* (2006.01)
*H01L 33/08* (2010.01)
(Continued)

(52) U.S. Cl.
CPC .......... *H01L 33/56* (2013.01); *H01L 25/0753* (2013.01); *H01L 27/156* (2013.01);
(Continued)

(58) Field of Classification Search
CPC ....... H01L 33/56; H01L 33/08; H01L 33/405; H01L 33/504; H01L 33/62; H01L 33/644; H01L 25/0753; H01L 27/156
See application file for complete search history.

(56) References Cited

U.S. PATENT DOCUMENTS 7,174,488 B1 2/2007 Chu
8,780,023 B2 * 7/2014 Ootorii ............... G09G 3/3208
345/82
(Continued)

FOREIGN PATENT DOCUMENTS

CN 101847601 9/2010
CN 103548136 1/2014
(Continued)

OTHER PUBLICATIONS

"Office Action of Taiwan Counterpart Application," dated Dec. 26, 2018, p. 1-p. 5.

*Primary Examiner* — Mark W Tornow
(74) *Attorney, Agent, or Firm* — JCIPRNET

(57) ABSTRACT

A photoelectric device package including a substrate, a first circuit layer, a carrier structure, a second circuit layer, at least one photoelectric device, and a first encapsulation layer is provided. The first circuit layer is disposed on the substrate. The carrier structure is disposed on the substrate and covers the first circuit layer. The carrier structure includes a first dielectric layer, a second dielectric layer, and an elastic layer disposed between the first dielectric layer and the second dielectric layer. The Young's modulus of the elastic layer is less than the Young's modulus of the first dielectric layer and the second dielectric layer. The second circuit layer is disposed on the carrier structure. The photoelectric device is disposed on the carrier structure and is electrically connected to the first and second circuit layers. The first
(Continued)

encapsulation layer is disposed on the carrier structure and encapsulates the photoelectric device.

20 Claims, 21 Drawing Sheets

(51) Int. Cl.
    *H01L 33/40*     (2010.01)
    *H01L 33/50*     (2010.01)
    *H01L 33/56*     (2010.01)
    *H01L 33/62*     (2010.01)
    *H01L 33/64*     (2010.01)
    *H01L 25/075*     (2006.01)

(52) U.S. Cl.
    CPC ............ *H01L 33/08* (2013.01); *H01L 33/405* (2013.01); *H01L 33/504* (2013.01); *H01L 33/62* (2013.01); *H01L 33/644* (2013.01)

(56) References Cited

U.S. PATENT DOCUMENTS

| | | |
|---|---|---|
| 9,484,504 B2 | 11/2016 | Bibl et al. |
| 9,490,407 B2 | 11/2016 | Ray et al. |
| 2014/0094878 A1 | 4/2014 | Gossler et al. |
| 2014/0339495 A1 | 11/2014 | Bibl et al. |
| 2016/0163770 A1 | 6/2016 | Kim et al. |
| 2016/0233269 A1 | 8/2016 | Choi et al. |
| 2016/0357052 A1* | 12/2016 | Kim ................. G02F 1/133305 |
| 2017/0110393 A1* | 4/2017 | Tain ..................... H05K 3/4673 |
| 2017/0122502 A1 | 5/2017 | Cok et al. |
| 2017/0153668 A1* | 6/2017 | Jang ..................... G06F 1/1641 |

FOREIGN PATENT DOCUMENTS

| | | |
|---|---|---|
| CN | 105981169 | 9/2016 |
| TW | 200839999 | 10/2008 |
| TW | I578571 | 4/2017 |

\* cited by examiner

PHOTOELECTRIC DEVICE PACKAGE

CROSS-REFERENCE TO RELATED APPLICATION

This application claims the priority benefits of a U.S. provisional application Ser. No. 62/516,057, filed on Jun. 6, 2017 and a Taiwan application serial no. 106145934, filed on Dec. 27, 2017. The entirety of each of the above-mentioned patent applications is hereby incorporated by reference herein.

BACKGROUND

Technical Field

This disclosure is related to a package of an electric device, especially related to a package of a photoelectric device.

Description of Related Art

In common flexible electronic products, the electronic components are usually packaged after they are disposed on a flexible substrate. However, the flexible electronic products configured in the above manner may be damaged during the manufacturing process or use due to stress on the electronic components, thereby affecting the quality of the flexible electronic products. How to reduce the stress applied to the electronic components to improve the yield of the flexible electronic products and the reliability of the products has become a problem to be solved at present.

SUMMARY

In an embodiment of this disclosure, a photoelectric device package comprises a first substrate, a first circuit layer, a carrier structure, a second circuit layer, at least one photoelectric device, and a first encapsulation layer. The first circuit layer is disposed on the first substrate. The carrier structure is disposed on the first substrate and covers the first circuit layer. The carrier structure includes a first dielectric layer, an elastic layer, and a second dielectric layer. The elastic layer is disposed between the first dielectric layer and the second dielectric layer. The Young's modulus of the elastic layer is less than the Young's modulus of the first dielectric layer and the second dielectric layer. The second circuit layer is disposed on the carrier structure. The photoelectric device is disposed on the carrier structure and is electrically connected to the first and second circuit layers. The first encapsulation layer is disposed on the carrier structure and encapsulates the photoelectric device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIGS. 1A-1H are partial cross-sectional schematic views of the manufacturing process of a photoelectric device package according to a first embodiment of this disclosure. FIG. 1I is a schematic partial top view of the photoelectric device package according to the first embodiment of this disclosure. FIG. 1J is an enlarged schematic view of area R1 in FIG. 1H. For the sake of clarity, some of the layers and components are omitted from FIG. 1I.

Figure 1A:
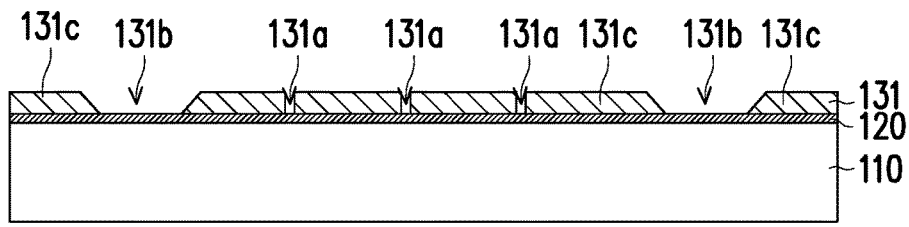
FIGS. 1A-1H are partial cross-sectional schematic views of the manufacturing process of a photoelectric device package according to a first embodiment of this disclosure.

Please refer to FIG. 1A, a first substrate 110 is provided. In this embodiment, the first substrate 110 may be a hard substrate or a flexible substrate having visible light transmittance. For example, the material of the aforementioned hard substrate is glass or other hard materials. The aforementioned flexible substrate material is, for example, a polyimide (PI), a polycarbonate (PC), a polyamide (PA), polyethylene terephthalate (PET), polyethylene naphthalate (PEN), polyethylenimine (PEI), a polyurethane (PU), polydimethylsiloxane (PDMS), an acrylate polymer (such as polymethylmethacrylate (PMMA)), an ether polymer (such as polyethersulfone (PES) or polyetheretherketone (PEEK)), a polyolefin, a metal foil, a thin glass or other flexible material, but this disclosure is not limited thereto.

Next, the first circuit layer 120 is formed on the first substrate 110. In this embodiment, a first conductive layer may be formed on the first substrate 110. In addition, the first conductive layer may be patterned by a patterning process, such as photolithography, to form the first circuit layer 120. The material of the first circuit layer 120 may be a transparent conductive material or an opaque conductive material. The aforementioned transparent conductive material is, for example, indium tin oxide (ITO), indium zinc oxide (IZO), etc. The aforementioned opaque conductive material is, for example, metal, but the disclosure is not limited thereto.

After the first circuit layer 120 is formed, the first dielectric layer 131 is formed on the first substrate 110. The first dielectric layer 131 may be made of an inorganic material and includes silicon oxide ($SiO_x$), silicon nitride ($SiN_x$), silicon oxynitride (SiON), aluminum oxide ($AlO_x$), aluminum oxynitride (AlON), or something else. In other embodiments, the first dielectric layer 131 may be made of an organic material including a polyimide (PI), a polycarbonate (PC), a polyamide (PA), polyethylene terephthalate (PET), polyethylene naphthalate (PEN), polyethylenimine (PEI), a polyurethane (PU), polydimethylsiloxane (PDMS), an acrylate polymer (such as polymethylmethacrylate (PMMA)), an ether polymer (such as polyethersulfone (PES) or polyetheretherketone (PEEK) etc.), a polyolefin, or other analogs or combinations thereof. In other feasible embodiments, the organic material and the inorganic material may be alternately stacked to form the first dielectric layer 131.

In this embodiment, mechanical drilling, laser drilling, etching process, or other suitable process may be used to form a plurality of first through holes 131a on the first dielectric layer 131. The first through holes 131a expose portions of the first circuit layer 120, so that a conductive substance may fill into the first through holes 131a in a subsequent process to electrically connect the first circuit layer 120 with other devices or layers.

In this embodiment, the first dielectric layer 131 may have a plurality of first grooves 131b, and the first dielectric layer 131 may have a plurality of first dielectric portions 131c separated from each other. However, this disclosure is not limited thereto. In other embodiments, the first dielectric layer 131 may also completely cover the first substrate 110.

Figure 1B:
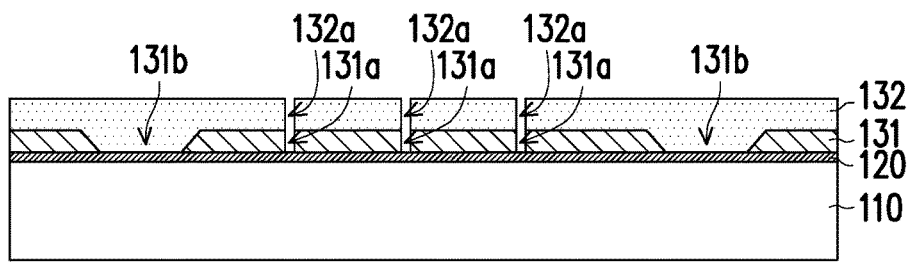

Referring to FIG. 1B, after the first dielectric layer 131 is formed, an elastic layer 132 is formed on the first substrate 110. The material of the elastic layer 132 includes an insulating elastic material. The Young's modulus of the elastic layer 132 is smaller than the Young's modulus of the first dielectric layer 131. That is, compared to the first dielectric layer 131, the elastic layer 132 undergoes greater plastic deformation after being stressed. For example, the material of the elastic layer 132 is a polymer having a chain structure, such as a rubber series adhesive, an acrylic series adhesive, or a silicone series adhesive. The rubber series adhesive includes a natural rubber and a synthetic rubber. The acrylic series adhesive includes a standard acrylic and a treated acrylic. The method of forming the elastic layer 132 may be, for example, a coating method, a sticking method, a sol-gel method or a pressure-bonding method. For example, after the elastic material is formed on the first substrate 110, the elastic material may be cured to form the elastic layer 132 by photopolymerization or baking according to the properties of the elastic material. In this embodiment, the Young's modulus of the first dielectric layer 131 may be between 20 gigapascals (GPa) and 450 GPa, and the Young's modulus of the elastic layer 132 may be between 0.1 megapascals (MPa) to 40 GPa, but this disclosure is not limited thereto.

In this embodiment, a plurality of second through holes 132a may be formed on the elastic layer 132 by mechanical drilling, laser drilling, etching or other suitable processes. The second through holes 132a correspond to the first through holes 131a, and the second through holes 132a expose the first circuit layer 120 exposed by the first through holes 131a. Therefore, a conductive substance may fill into the second through holes 132a and the first through holes 131a in a subsequent process to electrically connect the first circuit layer 120 with other devices or layers.

In this embodiment, the elastic layer 132 may be filled into the first grooves 131b of the first dielectric layer 131. In other words, the portions of the elastic layer 132 filled in the first grooves 131b may be in direct contact with the first circuit layer 120 and/or the first substrate 110.

Figure 1C:
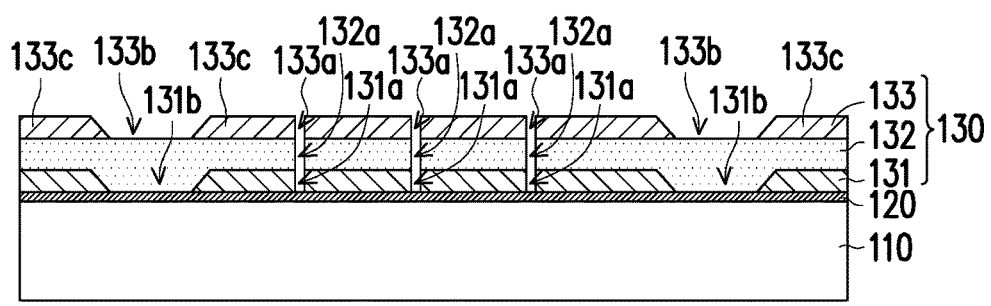

Referring to FIG. 1C, after the elastic layer 132 is formed, a second dielectric layer 133 is formed on the first substrate 110. The first dielectric layer 131, the elastic layer 132 and the second dielectric layer 133 may form the carrier structure 130. The material or the formation manner of the second dielectric layer 133 may be the same or similar to the material or the formation manner of the first dielectric layer 131, but the disclosure is not limited thereto. The Young's modulus of the elastic layer 132 is smaller than the Young's modulus of the second dielectric layer 133. That is, compared to the second dielectric layer 133, the elastic layer 132 undergoes greater plastic deformation after being stressed.

In this embodiment, a plurality of third through holes 133a may be formed on the second dielectric layer 133 by mechanical drilling, laser drilling, etching or other suitable processes. The third through holes 133a correspond to the second through holes 132a and the first through holes 131a, and the third through holes 133a, the second through holes 132a and the first through holes 131a form through holes 130a to expose the first circuit layer 120, so that a conductive substance may fill into the through holes 131a in a subsequent process to electrically connect the first circuit layer 120 with other devices or layers. In this embodiment, the first through holes 131a, the second through holes 132a, and the third through holes 133a may be formed in different steps, respectively, but this disclosure is not limited thereto. In other embodiments, the first through holes 131a, the second through holes 132a and the third through holes 133a may be respectively formed in the same step. In other words, after forming the second dielectric layer 133, the through holes 130a is formed through the first dielectric layer 131, the elastic layer 132, and the second dielectric layer 133.

In this embodiment, the second dielectric layer 133 may have a plurality of second grooves 133b, and the second dielectric layer 133 may have a plurality of second dielectric portions 133c separated from each other. However, this disclosure is not limited thereto. In other embodiments, the second dielectric layer 133 may also completely cover the elastic layer 132.

In this embodiment, the pattern of the first grooves 131b may correspond to the pattern of the second grooves 133b. In other words, the first dielectric portions 131c may correspond to the second dielectric portions 133c. In this embodiment, the areas of the first dielectric portions 131c are the same as the areas of the second dielectric portions 133c, but this disclosure is not limited thereto. In other embodiments, the areas of the first dielectric portions 131c and the areas of the second dielectric portion 133c may also be different.

Figure 1D:
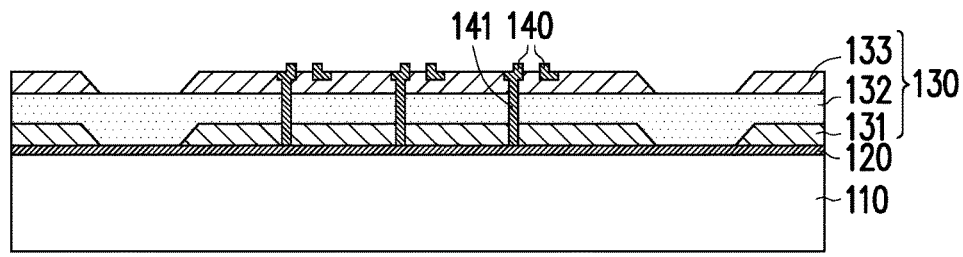

Referring to FIG. 1D, after the through holes 130a are formed, the through holes 130a may be filled with a conductive material by a suitable process such as a deposition process and/or a plating process to form a plurality of conductive vias 141. The conductive vias 141 may be electrically connected to the first circuit layer 120. In this embodiment, the conductive material filling into the through holes 130a may further cover at least the second dielectric layer 133 of the carrier structure 130. Subsequently, for example, the conductive material covering the second dielectric layer 133 may be patterned by lithography and etching to form the second circuit layer 140, and a portion of the second circuit layer 140 on the conductive vias 141 may be electrically connected to the first circuit layer 120 through the conductive vias 141.

Figure 1E:
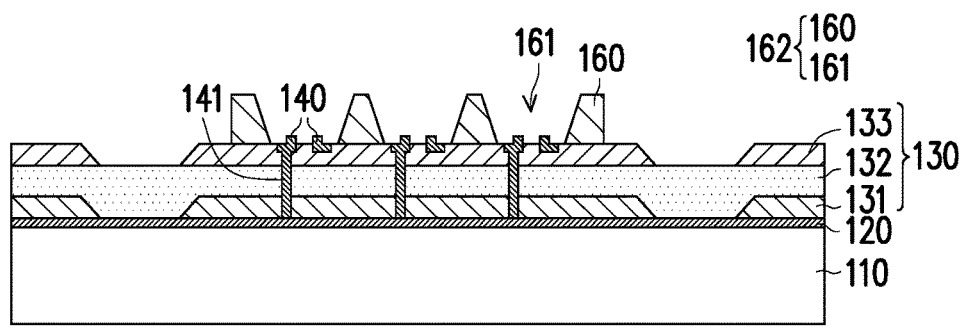

Referring to FIG. 1E, after the conductive vias 141 is formed, the light output parts 160 may be disposed on the carrier structure 130. In this embodiment, for example, a polyester resin, an epoxy resin, a silicone resin or other suitable polymer materials may be formed on the carrier structure 130 by injection-molding. Moreover, the aforementioned polymer materials may be cured by light curing or thermal curing to form the light guide structure 162 having the light guide areas 161 and the light output parts 160. The light guide areas 161 expose portions of the second circuit layer 140, and the aforementioned light guide areas 161 may be used to accommodate, for example, the photoelectric devices 150 (shown in FIG. 1F) in a subsequent manufacturing process. However, in this disclosure, the formation method or material of the light output parts 160 are not limited. In other embodiments, the light output parts 160 may also be formed into a specific shape in a pre-formed manner. The material of the pre-formed light output parts 160 may be, for example, glass, quartz, silicone, polymethacrylate, polycarbonate or other suitable materials, and the preformed light output parts 160 may be fixed on the carrier structure 130 by an adhesive.

In terms of structure, the light output parts 160 of the photoelectric device package 100 have a light-emitting performance in application. During the manufacturing of the photoelectric device package 100, the light output parts 160 may also have a function similar to dams to prevent materials, for forming the first encapsulating layer 170, from being overflowed during the manufacturing process of the first encapsulating layer 170.

Figure 1F:
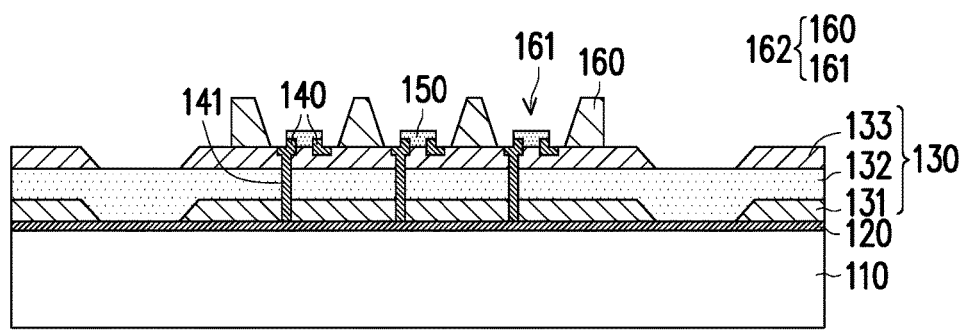

Referring to FIG. 1F, after the light output parts 160 are forming, a chip bonding process may be used to dispose the at least one photoelectric device 150 on the carrier structure 130 and in the light guide areas 161 of the light guide structures 162. The aforementioned photoelectric devices 150 are electrically connected to the second circuit layer 140 and electrically connected to the first circuit layer 120 through the conductive vias 141. In the cross-section shown in FIG. 1F, the number of the photoelectric devices 150 is three, but the number of the photoelectric devices 150 or the wavelength of the light emitted by the photoelectric devices 150 is not limited in this disclosure.

In this embodiment, the photoelectric devices 150 may be a light-emitting diode (LED), a mini LED, or a micro LED (μLED). The active surfaces of the photoelectric devices 150 may face the carrier structure 130. The photoelectric devices 150 may be bound by direct bonding, eutectic bonding, solder ball or bump bonding, silver glue or solder paste bonding. In other words, the photoelectric devices 150 may be connected to the second circuit layer 140 by flip chip bonding, but this disclosure is not limited thereto.

Figure 1G:
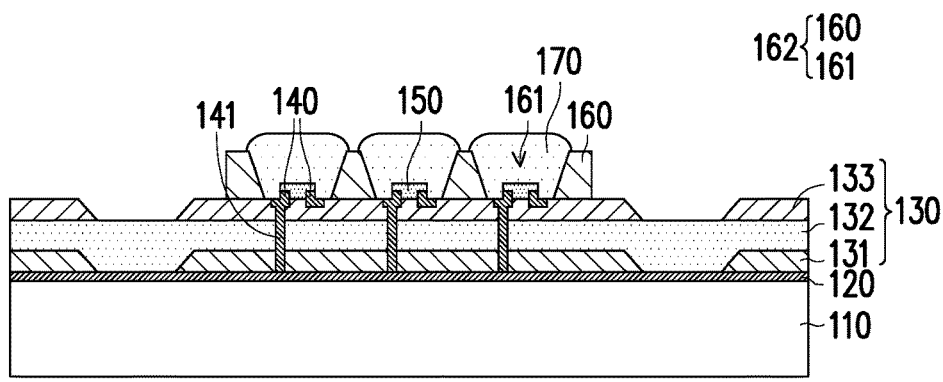

Referring to FIG. 1G, after the photoelectric devices 150 are disposed on the carrier structure 130, first encapsulating layers 170 are formed on the carrier structure 130. The material of the first encapsulation layer 170 is poly(methyl methacrylate), polycarbonate, or other suitable rigid encapsulation material, for example. The first encapsulation layer 170 fill into at least the light guide areas 161 of the light guide structures 162 to encapsulate at least the photoelectric devices 150 and portions of the second circuit layer 140. Thus, the protection capability of the photoelectric devices 150 is enhanced.

In this embodiment, the first encapsulation layer 170 cover portions of the light output parts 160, but this disclosure is not limited thereto. In other embodiments, the first encapsulation layer 170 may further encapsulate the entire light output parts 160.

Figure 1H:
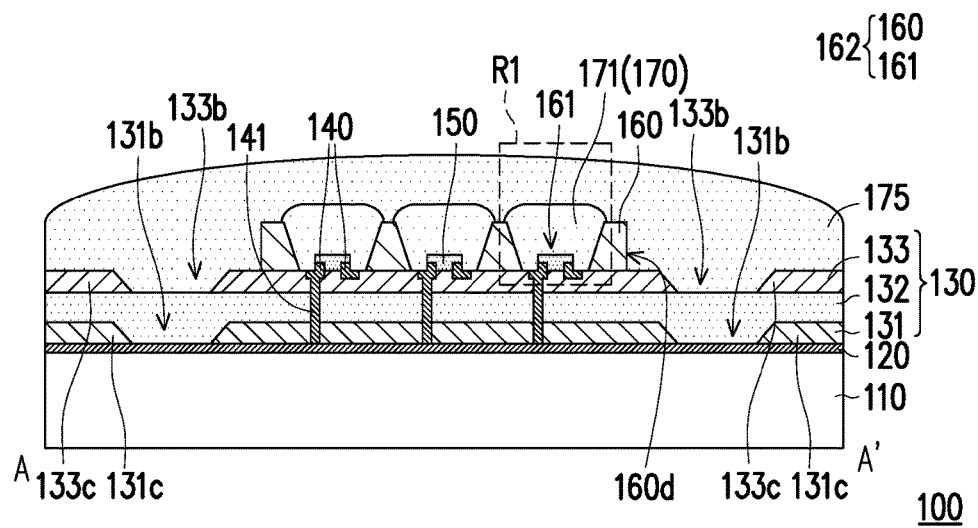
Figure 1I:
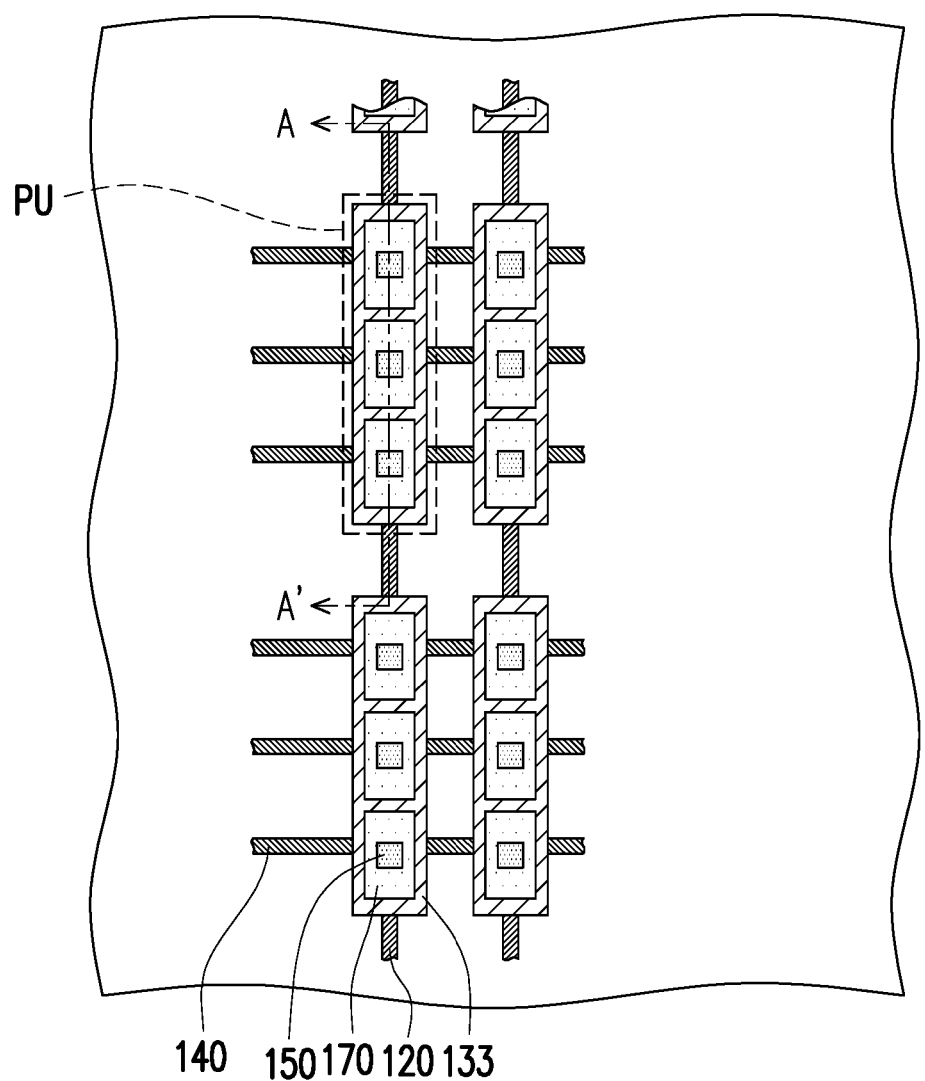
FIG. 1I is a schematic partial top view of the photoelectric device package according to the first embodiment of this disclosure.
Figure 1J:
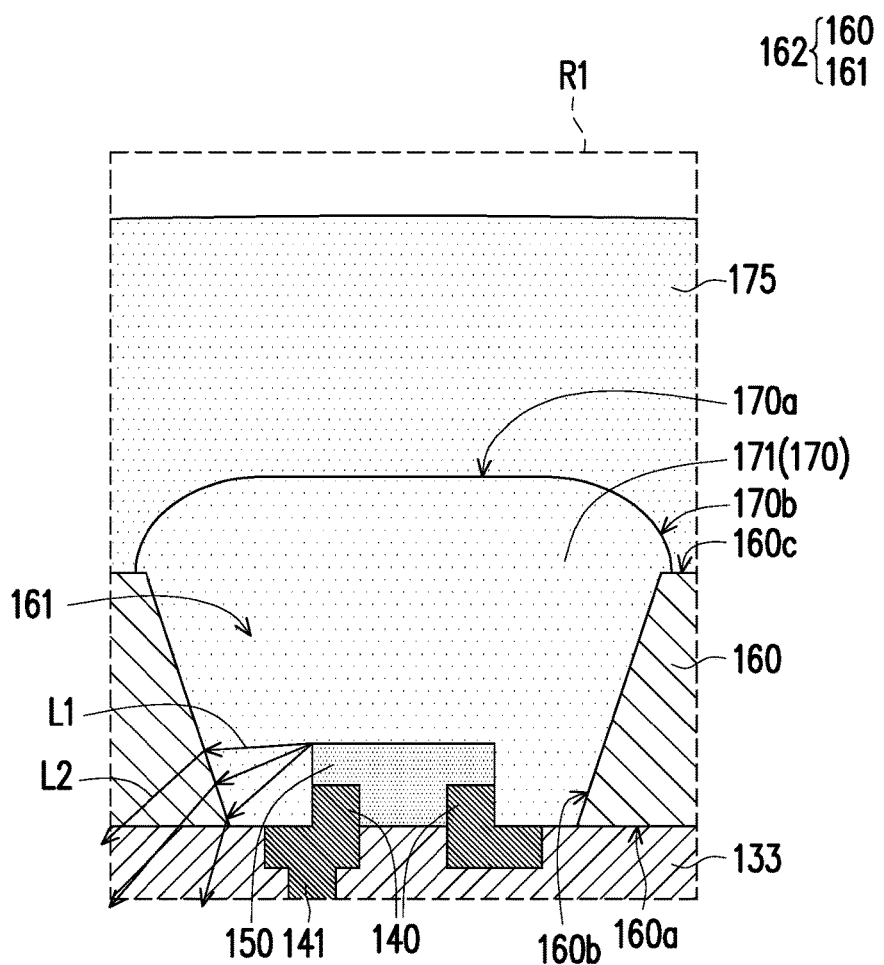
FIG. 1J is an enlarged schematic view of area R1 in FIG. 1H.

Referring to FIG. 1H, in this embodiment, after forming the first encapsulation layer 170, a second encapsulation layer 175 may be formed on the carrier structure 130. The material or formation manner of the second encapsulation layer 175 may be similar to that of the first encapsulation layer 170. The Young's modulus of the second encapsulation layer 175 may be smaller than the Young's modulus of the first encapsulation layer 170 to enhance the bending or flexing capability of the photoelectric device package 100

Please refer to FIGS. 1H-1J. After the above process, the preparation of the photoelectric device package 100 of this embodiment is substantially completed. The above-mentioned photoelectric device package 100 may include the first substrate 110, the first circuit layer 120, the carrier structure 130, the second circuit layer 140, the light guide structures 162, the photoelectric devices 150, the first encapsulation layer 170, and the second encapsulation layer 175.

The photoelectric devices 150 are carried by the second dielectric layer 133 of the carrier structure 130. The elastic layer 132 is located between the first dielectric layer 131 and the second dielectric layer 133 carrying the photoelectric devices 150. The Young's modulus of the elastic layer 132 is smaller than the Young's modulus of the first dielectric layer 131 and the Young's modulus of the second dielectric layer 133. In this way, the elastic layer 132 may absorb and buffer the stress, so as to reduce the possible damage of the photoelectric device 150 due to the force taken by the photoelectric device package 100. Therefore, the yield and quality of the photoelectric device package 100 is improved.

The first dielectric layer 131 of the carrier structure 130 covers the first circuit layer 120. The second circuit layer 140 is located on the second dielectric layer 133 of the carrier structure 130. A portion of the second circuit layer 140 is electrically connected to the first circuit layer 120 through conductive vias 141 penetrating the first dielectric layer 131, the elastic layer 132 and the second dielectric layer 133. The photoelectric device 150 is electrically connected to the second circuit layer 140 on the second dielectric layer 133, and the opposite two ends of the conductive vias 141 contacting the first circuit layer 120 and the second circuit layer 140 respectively are located in/on the first dielectric layer 131 and the second dielectric layer 133. In this way, the cracks, breaks or other defects reducing conductivity of the photoelectric device package 100, caused by bending or deflecting the photoelectric device package 100 due to force taken, may be reduced to improve the yield and quality of the photoelectric device package 100.

In this embodiment, the first dielectric layer 131 may be formed by a plurality of first dielectric portions 131c separated by a plurality of first grooves 131b. The second dielectric layer 133 may be formed by a plurality of second dielectric portions 133c separated by a plurality of the second grooves 133b. The first grooves 131b may correspond to the second grooves 133b. The areas of the first dielectric portions 131c are substantially the same as the areas of the corresponding second dielectric portions 133c, and the first dielectric portions 131c and the corresponding second dielectric portions 133c may overlap each other. The elastic layer 132 is disposed between the first grooves 131b and the second grooves 133b, and the elastic layer 132 fills at least the first grooves 131b. As such, each of the second dielectric portions 133c located on the elastic layer 132 may be similar to an islanding structure. Therefore, when the photoelectric device package 100 is stressed, a stress absorption or buffering effect may be formed to reduce the stress applied to the supported photoelectric device 150, and the flex resistance of the photoelectric device package 100 may be improved.

The light output part 160 is located on the carrier structure 130 and surrounds the photoelectric device 150, so that the first light beam L1 emitted by the photoelectric device 150 may be emitted toward a predetermined direction by reflection and/or refraction. That is, the second light beam L2 that exits the light output part 160.

The photoelectric devices 150 are disposed on the carrier structure 130 and electrically connected to the first circuit layer 120 and the second circuit layer 140. Specifically, the photoelectric devices 150 may be electrically connected to a power supply voltage (Vdd) via portions of the second circuit layer 140, the conductive vias 141, and the first circuit layer 120. The photoelectric devices 150 may be grounded or electrically connected to a common voltage (Vcom) via the remaining parts of the second circuit layer 140 which are not in contact with the conductive vias 141. In other words, the first circuit layer 120 and portions of the second circuit layer 140 contacting the conductive vias 141 may be pixel electrodes, and the remaining portions of the second circuit layer 140 not contacting the conductive vias 141 may be common electrodes. In this way, the photoelectric devices 150 may be driven to generate the first light beam L1 with a wavelength corresponding to the voltage difference between the pixel electrodes and the common electrodes.

In this embodiment, the number of the photoelectric devices 150 may be plural. The first encapsulation layer 170 includes a plurality of first encapsulation portions 171 separated from each other, and each of the first encapsulation portions 171 encapsulates the corresponding photoelectric devices 150. The plurality of photoelectric devices 150 on the same second dielectric portions 133c may constitute pixel units PU. The plurality of pixel units PU on the first substrate 110 may be arranged in an array, but this disclosure is not limited thereto.

In this embodiment, the light output parts 160 each has a first surface 160a, a second surface 160b, a third surface 160c, and a fourth surface 160d. The first surface 160a faces the carrier structure 130. The second surface 160b faces the photoelectric device 150 to form the light guide area 161. The area of the third surface 160c may be smaller than the area of the first surface 160a, and the first encapsulation layer 170 filled in the light guide area 161 may further cover a portion of the third surface 160c. The first surface 160a, the second surface 160b, the third surface 160c, and the fourth surface 160d may form a quadrangular structure similar to a trapezoid on a cross section perpendicular to the first substrate 110 (e.g., the paper surface in FIG. 1H). In addition, the material of the light output parts 160 has a low absorption coefficient in the wavelength range of the first light beam L1, and the refractive index of the light output parts 160 is less than the refractive index of the first encapsulating layers 170. In this way, the first light L1 emitted by the photoelectric device 150 may be refracted at the second surface 160b of the light output part 160, so that the first light L1 emitted by the photoelectric device 150 may be refracted toward the direction of the first substrate 110 to emit the second light beam L2. That is, the photoelectric device package 100 of this embodiment has a refractive type bottom-emitting structure, but this disclosure is not limited thereto.

The first encapsulation layer 170 is located on the carrier structure 130 and encapsulates at least the photoelectric device 150. The second encapsulation layer 175 is located on the carrier structure 130 and laterally covers the side surface 170*b* of the first encapsulation layer 170 and covers the upper surface 170*a* of the first encapsulation layer 170. The Young's modulus of the first encapsulation layer 170 is greater than the Young's modulus of the second encapsulation layer 175 so as to enhance the protection capability of the photoelectric device 150. Compared with the first encapsulation layer 170, the second encapsulation layer 175 having a lower Young's modulus may connect/contact the elastic layer 132 through the second grooves 133*b* to enhance the effect of stress absorption or buffering. In this embodiment, the Young's modulus of the first encapsulation layer 170 may be from 20 GPa to 500 GPa, and the Young's modulus of the second encapsulation layer 175 may be from 0.1 MPa to 40 GPa, but this disclosure is not limited to this.

In this embodiment, the second dielectric layer 133, the light output parts 160 and the first encapsulation layer 170 may jointly form a protection structure to cover the photoelectric device 150 between the elastic layer 132 and the second encapsulation layer 175. In this way, the photoelectric devices 150 may be protected by the first dielectric layer 131 and the first encapsulation layer 170 and/or the elastic layer 132 and the second encapsulation layer 175. Further, in the use of the photoelectric device package 100, if a stress is applied to the photoelectric device package 100 to generate a corresponding bend or deflection, the light output parts 160 of the light guide structures 162 disposed between the two adjacent photoelectric devices 150 may be a buffer. Therefore, the corresponding stress applied to the photoelectric devices 150 is reduced to reduce the possibility of the photoelectric devices 150 being damaged and disconnected from the second circuit layer 140 and/or the conductive vias 141. In addition, the elastic layer 132 is disposed between the photoelectric devices 150 and the first dielectric layer 131. Compared with the first dielectric layer 131, the elastic layer 132 undergoes greater plastic deformation after being stressed. After the stress is applied to the photoelectric device package 100, at least the elastic layer 132 may be used to reduce the stress between the photoelectric device package 100 and the first dielectric layer 131 to reduce the risk of the photoelectric devices 150 coming off from the first dielectric layer 131 and/or the first substrate 110 and to avoid the possibility that the photoelectric devices 150 are detached or the wiring is disconnected.

Figure 2A:
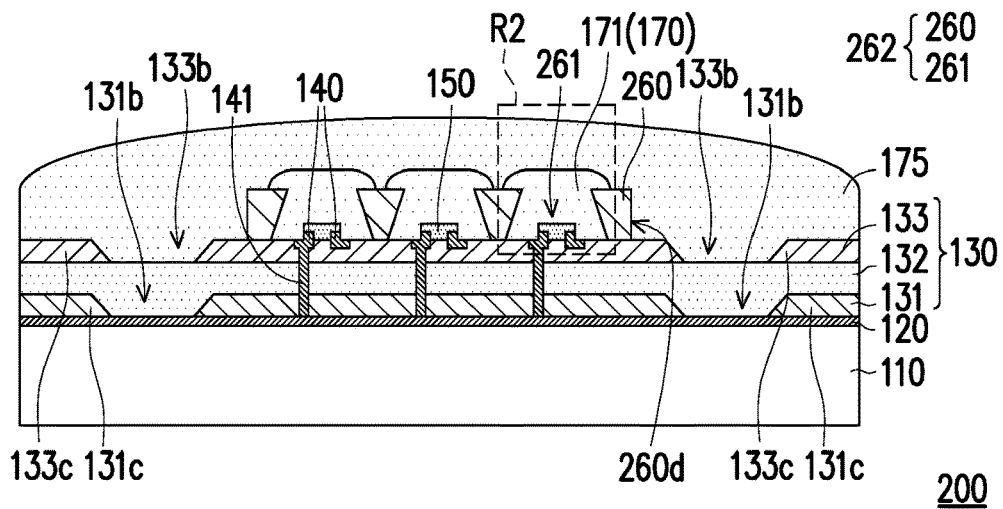
FIG. 2A is a partial cross-sectional view of a photoelectric device package according to a second embodiment of this disclosure.
Figure 2B:
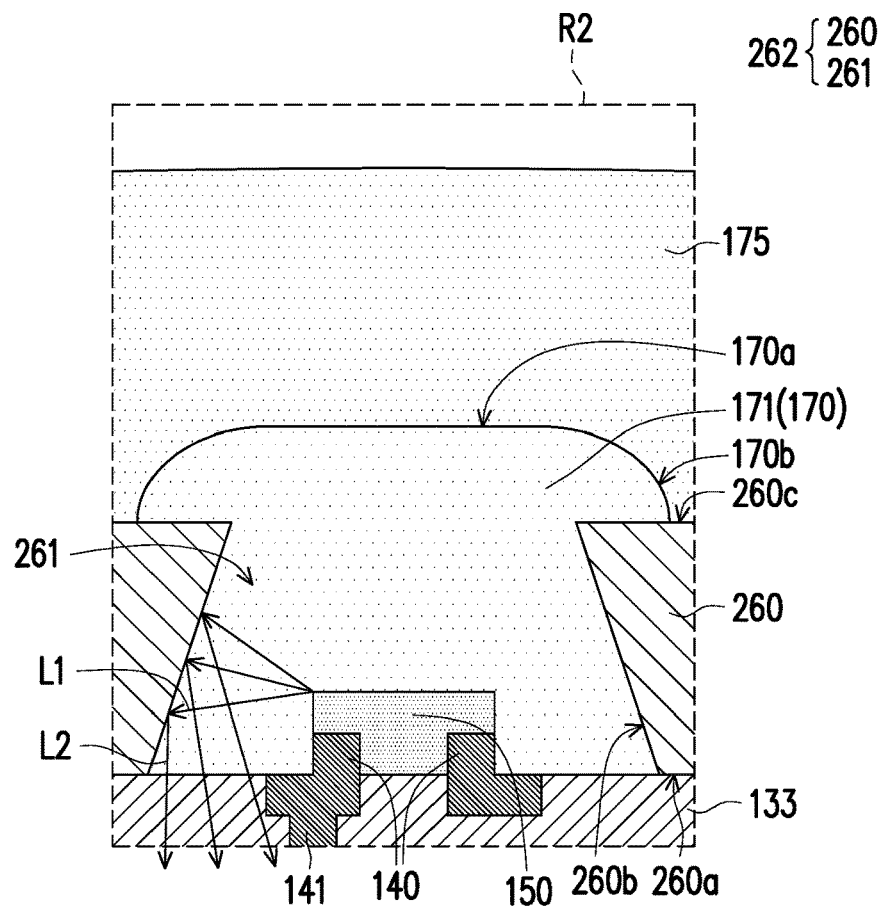
FIG. 2B is an enlarged schematic view of area R2 in FIG. 2A.

FIG. 2A is a partial cross-sectional view of a photoelectric device package according to a second embodiment of this disclosure. FIG. 2B is an enlarged schematic view of area R2 in FIG. 2A. The photoelectric device package 200 of the second embodiment is similar to the photoelectric device package 100 of FIGS. 1H to 1J. This embodiment will be described with respect to the photoelectric device package 200 by using FIGS. 2A and 2B. Note that, in FIGS. 2A and 2B, the same or similar reference numerals denote the same or similar components, and therefore, the components described with reference to FIGS. 1H-1J are not described herein again.

Please refer to FIGS. 2A and 2B. The light output parts 260 of the photoelectric device package 200 of this embodiment each has a first surface 260*a*, a second surface 260*b*, a third surface 260*c*, and a fourth surface 260*d*. The first surface 260*a* faces the carrier structure 130. The second surface 260*b* faces the photoelectric device 150 to form the light guide area 261 of the light guide structure 262. The area of the third surface 260*c* may be larger than the area of the first surface 260*a*, and the second surface 260*b* facing the photoelectric device 150 may be an optical reflective surface. In detail, the first surface 260*a*, the second surface 260*b*, the third surface 260*c* and the fourth surface 260*d* may form a quadrangular structure similar to an inverted trapezoid in a cross-section perpendicular to the first substrate 110 (e.g., the paper surface in FIG. 2A or FIG. 2B).

In another embodiment, the refractive index of the light output parts 260 of the light guide structures 262 may be smaller than the refractive index of the first encapsulation layer 170. In this way, the first light L1 emitted by the photoelectric device 150 may totally reflect on the second surfaces 160*b* of the light output parts 260, so that the first light beam L1 emitted by the photoelectric devices 150 may form the second light beam L2 emitted toward the direction of the first substrate 110 by reflection. That is, the photoelectric device package 200 of this embodiment has a reflective type bottom-emitting structure, but this disclosure is not limited thereto. In other embodiments, the second surface 260*b* may also have a material capable of reflecting the first light beam L1, so that the first light beam L1 forms a second reflected light beam L2 on the second surface 260*b*.

Figure 3:
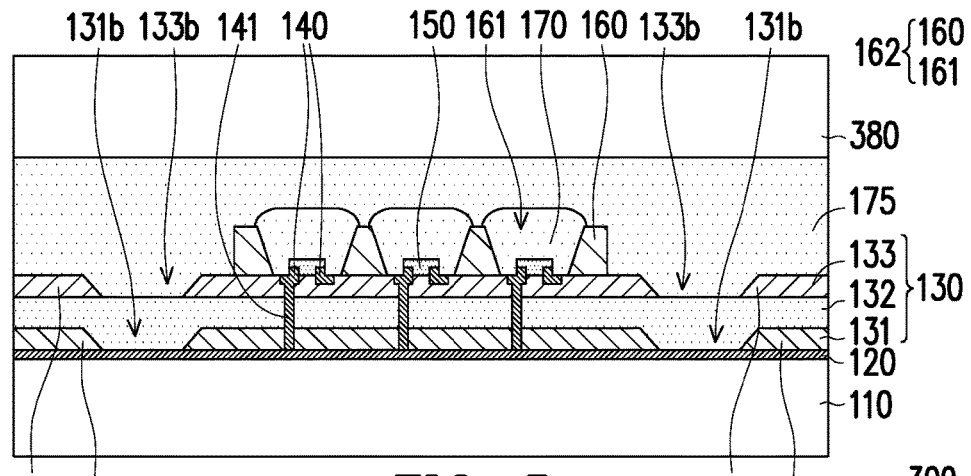
FIG. 3 is a partial cross-sectional view of a photoelectric device package according to a third embodiment of this disclosure.

FIG. 3 is a partial cross-sectional view of a photoelectric device package according to a third embodiment of this disclosure. The photoelectric device package 300 of the third embodiment is similar to the photoelectric device package 200 of FIGS. 2A and 2B. This embodiment will be described with reference to the photoelectric device package 300 of FIG. 3. In FIG. 3, the same or similar reference numerals denote the same or similar components, and therefore, the components described in FIG. 2A and FIG. 2B are not described herein again.

Please refer to FIG. 3. The photoelectric device package 300 of this embodiment further comprises a second substrate 380, wherein the first circuit layer 120, the carrier structure 130, the second circuit layer 140, the light guide structure 162, the photoelectric devices 150, the first encapsulation layer 170 and the second encapsulation layer 175 are located between the first substrate 110 and the second substrate 380. The second substrate 380 may cover the second encapsulation layer 175 to enhance the protection capability of the photoelectric device 150. In some embodiments, the second substrate 380 may have flexibility, light transmittance and/or thermal conductivity according to design requirements, which are not limited in this disclosure.

Figure 4:
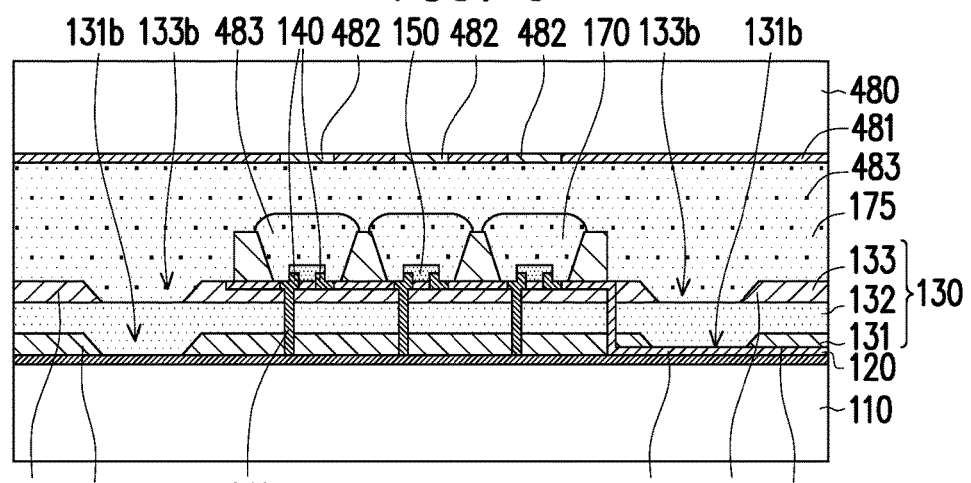
FIG. 4 is a partial cross-sectional view of a photoelectric device package according to a fourth embodiment of this disclosure.

FIG. 4 is a partial cross-sectional view of a photoelectric device package according to a fourth embodiment of this disclosure. The photoelectric device package 400 of the fourth embodiment is similar to the photoelectric device package 300 of FIG. 3, and this embodiment is described with reference to the photoelectric device package 400 in FIG. 4. In FIG. 4, the same or similar reference numerals denote the same or similar components, and therefore, the components described with respect to FIG. 3 are not described again herein.

Please refer to FIG. 4. The second substrate 480 of the photoelectric device package 400 of this embodiment may have thermal conductivity so as to improve heat dissipation of the photoelectric device package 400.

In this embodiment, the photoelectric device package 400 may further comprise a heat conducting film 481, heat conducting wires 482, and/or heat dissipation particles 483. The material of the heat conducting film 481 may comprise graphene, nano-silver or the like, or a combination thereof. The heat conducting film 481 may be disposed corresponding to the photoelectric device 150 or disposed on the second substrate 480. The material of the heat conducting wires 482 may be metal, and the heat conducting wires 482 may be disposed corresponding to the photoelectric device 150 and separated from the first circuit layer 120 and the second circuit layer 140. The material of the heat dissipation particles 483 may comprise boron nitride or the like, and the heat dissipation particles 483 may be distributed in the first encapsulation layer 170 and/or the second encapsulation layer 175. In this way, the heat dissipation capability of the photoelectric device package 400 may be enhanced by the heat conducting film 481, the heat conducting wires 482 and/or the heat dissipating particles 483.

Figure 5:
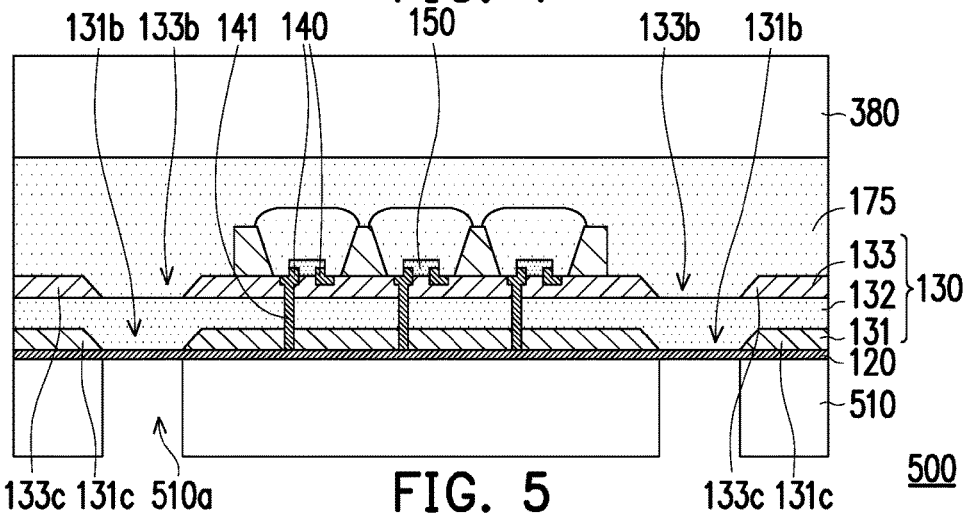
FIG. 5 is a partial cross-sectional view of a photoelectric device package according to a fifth embodiment of this disclosure.

FIG. 5 is a partial cross-sectional view of a photoelectric device package according to a fifth embodiment of this disclosure. The photoelectric device package 500 of the fifth embodiment is similar to the photoelectric device package 200 of FIG. 2. This embodiment will be described with reference to the photoelectric device package 500 of FIG. 5. In FIG. 5, the same or similar reference numerals denote the same or similar components, and therefore, the components described with respect to FIG. 2 are not described herein again.

Please refer to FIG. 5. The photoelectric device package 500 of this embodiment may form a plurality of substrate openings 510*a* on the first substrate 510 by etching, cutting, Computer Numerical Control (CNC) punching, or other suitable methods. The substrate opening 510*a* may be disposed to be corresponding to the first grooves 131*b* and/or the second grooves 133*b*. In other words, the first dielectric layer 131 and/or the second dielectric layer 133 may not overlap with the substrate opening 510*a*. In this way, the bendable or deflectable ability of the photoelectric device package 500 may be enhanced by the substrate opening 510*a* of the first substrate 510.

Figure 6:
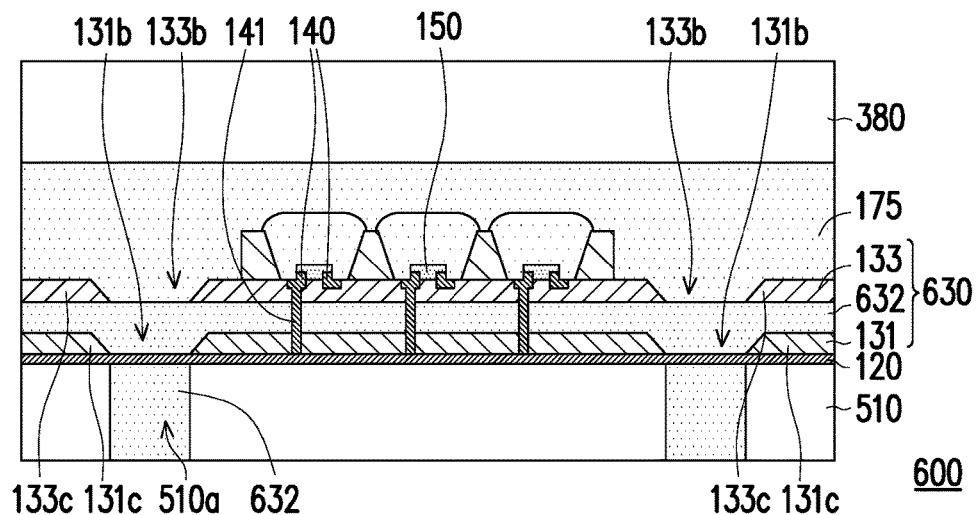
FIG. 6 is a partial cross-sectional view of a photoelectric device package according to a sixth embodiment of this disclosure.

FIG. 6 is a partial cross-sectional view of a photoelectric device package according to a sixth embodiment of this disclosure. The photoelectric device package 600 of the sixth embodiment is similar to the photoelectric device package 500 of FIG. 5, and this embodiment will be described with reference to the photoelectric device package 600 of FIG. 6. In FIG. 6, the same or similar reference numerals denote the same or similar components, and therefore, the components described with respect to FIG. 5 are not described herein again.

Please refer to FIG. 6. The elastic layer 632 of the carrier structure 630 of the photoelectric device package 600 of this embodiment is further filled in the substrate opening 510*a*. In this embodiment, the Young's modulus of the first substrate 510 and the Young's modulus of the elastic layer 632 may be greater than or equal to 10. Alternatively, in another embodiment, a ratio of the Young's modulus of the first substrate 510 to the Young's modulus of the elastic layer 632 may be greater than or equal to 50. Alternatively, in another embodiment, a ratio of the Young's modulus of the first substrate 510 to the Young's modulus of the elastic layer 632 may be greater than or equal to 100. That is, compared with the first substrate 510, the elastic layer 632 undergoes greater plastic deformation after being stressed.

Figure 7:
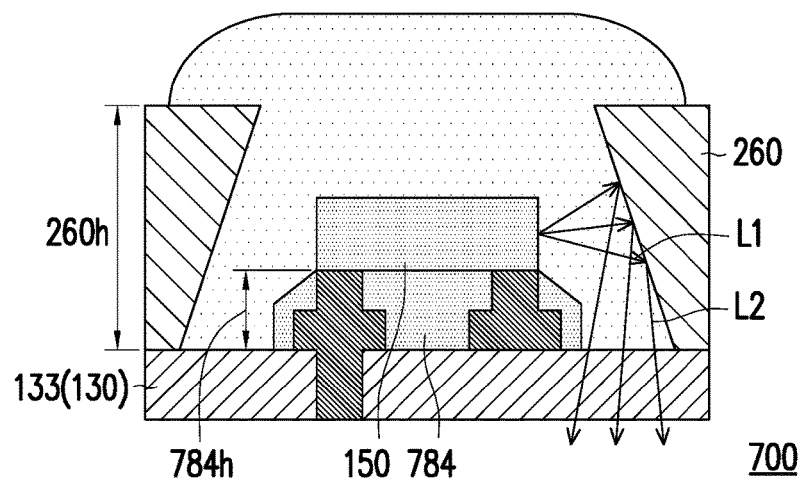
FIG. 7 is a partial cross-sectional view of a photoelectric device package according to a seventh embodiment of this disclosure.

FIG. 7 is a partial cross-sectional view of a photoelectric device package according to a seventh embodiment of this disclosure. The photoelectric device package 700 of the seventh embodiment is similar to the photoelectric device package 200 of FIGS. 2A and 2B, and this embodiment will be described with reference to the photoelectric device package 700 of FIG. 7. In FIG. 7, the same or similar reference numerals denote the same or similar components, and therefore, the components described with respect to FIG. 2A and FIG. 2B are not described herein again.

Please refer to FIG. 7. The photoelectric device package 700 of this embodiment further comprises a raising structure 784. The raising structure 784 is located between the photoelectric device 150 and the carrier structure 130. The raising height 784*h* of the raising structure 784 is smaller than the light guide thickness 260*h* of the light output part 260. In this way, the relative distance between the photoelectric device 150 and the carrier structure 130 and/or the light output part 260 may be adjusted by the raising structure 784. Therefore, the position or direction in which the first light beam L1 is emitted may be adjusted according to design requirements to change the direction of the light (i.e. the second light beam L2) emitted by the photoelectric device package 700.

Figure 8:
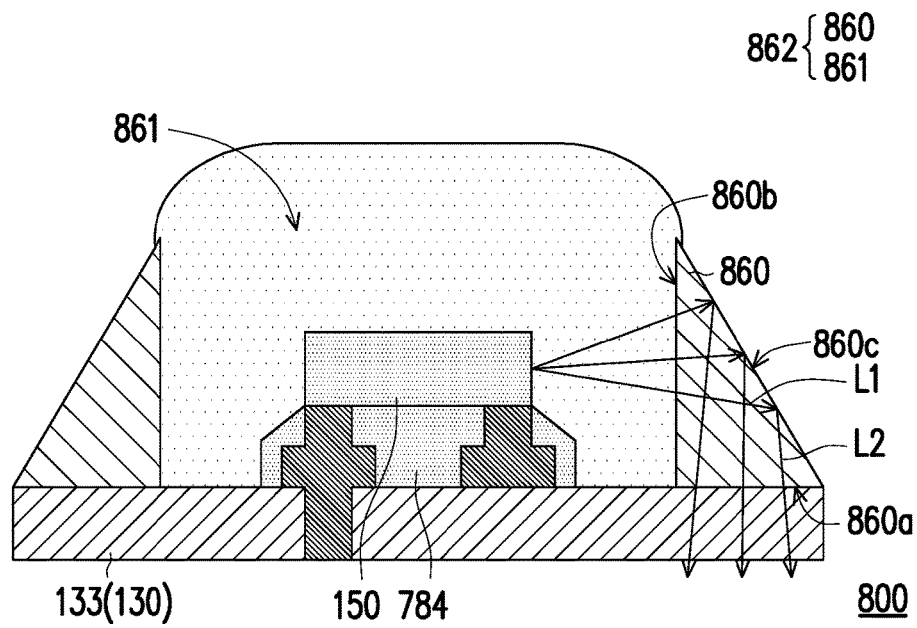
FIG. 8 is a partial cross-sectional view of a photoelectric device package according to an eighth embodiment of this disclosure.

FIG. 8 is a partial cross-sectional view of a photoelectric device package according to an eighth embodiment of this disclosure. The photoelectric device package 800 of the eighth embodiment is similar to the photoelectric device package 700 of FIG. 7, and this embodiment will be described with reference to the photoelectric device package 800 of FIG. 8. In FIG. 8, the same or similar reference numerals denote the same or similar components, and therefore, the components for the components illustrated in FIG. 7 are not described again herein.

Please refer to FIG. 8. The photoelectric device package 800 of this embodiment includes a light guide structure 862. The light output part 860 of the light guide structure 862 has a first surface 860*a*, a second surface 860*b*, and a third surface 860*c*. The first surface 860*a* faces the carrier structure 130, and the second surface 860*b* faces the photoelectric device 150 to form a light guide area 861 of the light guide structure 862. The first surface 860*a*, the second surface 860*b*, and the third surface 860*c* may form a triangular structure on a cross section perpendicular to the first substrate 110 (e.g., the paper surface in FIG. 8). The material of the light output part 860 has a low absorption coefficient in the wavelength range of the first light beam L1. In this embodiment, the third surface 860*c* may be an optical reflective surface, so that the first light beam L1 emitted by the photoelectric device 150 may form the second light beam L2 emitted toward the first substrate 110 by reflection.

In this embodiment, the third surface 860*c* may comprise a material capable of reflecting the first light beam L1, but this disclosure is not limited thereto. In other embodiments, the refractive index of the light output part 860 may be greater than the refractive index of a medium (such as air or the second encapsulation layer 175) on the third surface 860*c*, so that the first light beam L1 may be reflected by the third surface 860*c* of the light output part 860 to produce total reflection.

Figure 9:
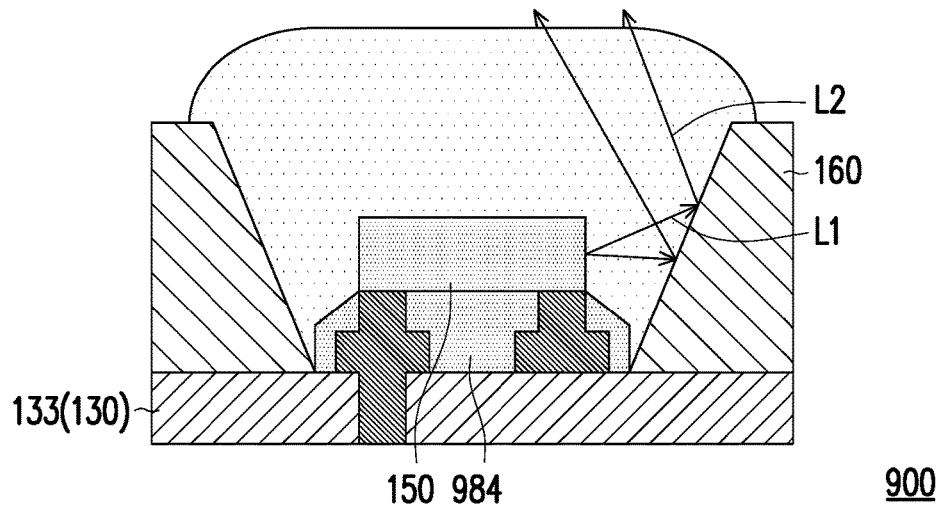
FIG. 9 is a partial cross-sectional view of a photoelectric device package according to a ninth embodiment of this disclosure.

FIG. 9 is a partial cross-sectional view of a photoelectric device package according to a ninth embodiment of this disclosure. The photoelectric device package 900 of the ninth embodiment is similar to the photoelectric device package 100 of FIGS. 1H-1J, and this embodiment will be described with respect to the photoelectric device package 900 using FIG. 9. In FIG. 9, the same or similar reference numerals denote the same or similar components, and therefore, the components described with reference to FIGS. 1H-1J are not described herein again.

Referring to FIG. 9, the photoelectric device package 900 of this embodiment further includes a raising structure 984 similar to the previous embodiment.

Figure 10:
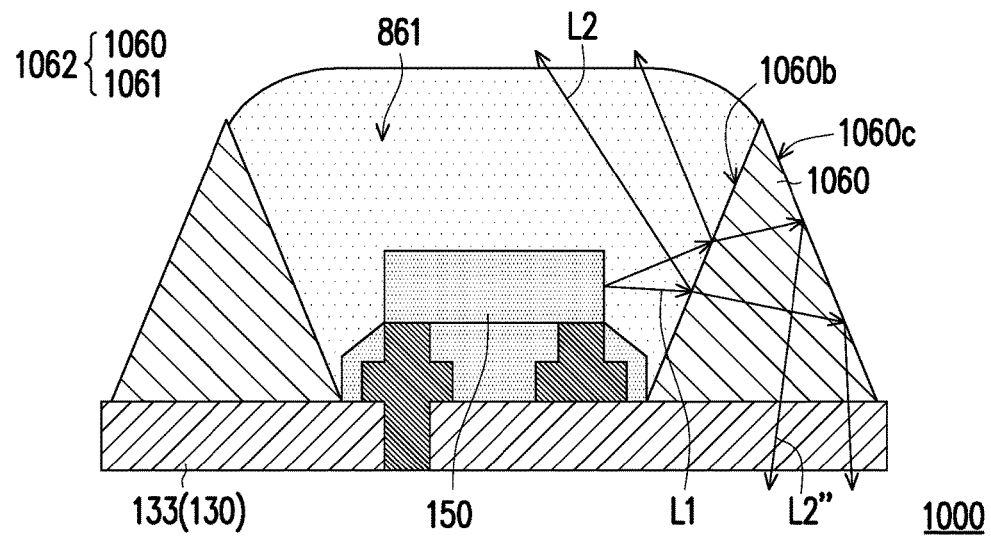
FIG. 10 is a partial cross-sectional view of a photoelectric device package according to a tenth embodiment of this disclosure.

FIG. 10 is a partial cross-sectional view of a photoelectric device package according to a tenth embodiment of this disclosure. The photoelectric device package 1000 of the tenth embodiment is similar to the photoelectric device package 800 of FIG. 8, and this embodiment will be described with respect to the photoelectric device package 1000 using FIG. 10. In FIG. 10, the same or similar reference numerals denote the same or similar components, and therefore, the components described with reference to FIG. 8 are not described herein again.

Please refer to FIG. 10. The photoelectric device package 1000 of this embodiment includes a light guide structure 1062. The second surface 1060b of the light output part 1060 of the light guide structure 1062 is a transflective surface, and the third surface 1060c may be an optical reflective surface. The first light beam L1 emitted toward the second surface 1060b may be partially reflected by the second surface 1060b and partially penetrate the second surface 1060b. In this case, a part of the second light beam L2 may be emitted in a direction away from the first substrate 110 and the remaining part of the second light beam L2" may be emitted toward the first substrate 110. That is, the photoelectric device package 1000 of this embodiment has a bifacial light emitting structure.

Figure 11:
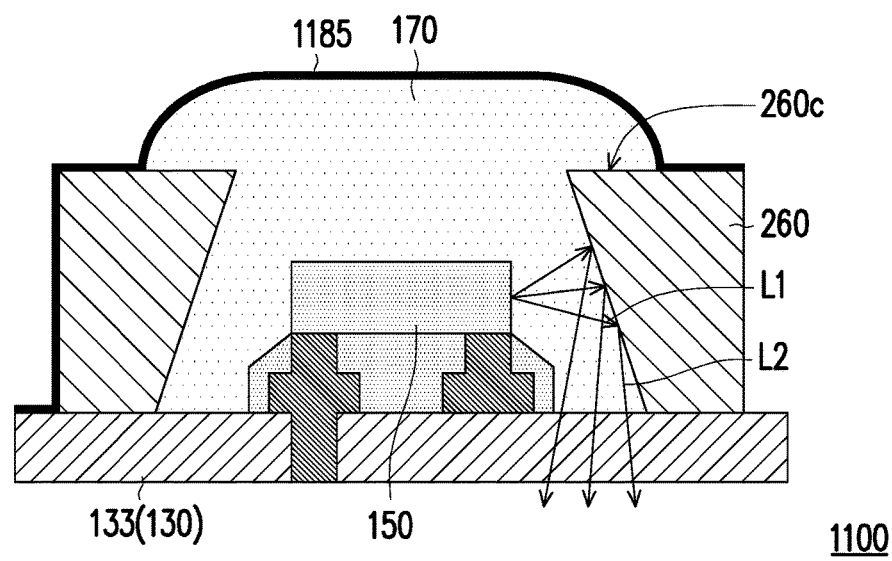
FIG. 11 is a partial cross-sectional view of a photoelectric device package according to an eleventh embodiment of this disclosure.

FIG. 11 is a partial cross-sectional view of a photoelectric device package according to an eleventh embodiment of this disclosure. The photoelectric device package 1100 of the eleventh embodiment is similar to the photoelectric device package 700 of FIG. 7, and this embodiment will be described with reference to the photoelectric device package 1100 using FIG. 11. In FIG. 11, the same or similar reference numerals denote the same or similar components, and therefore, the components for the components illustrated in FIG. 7 are not described herein again.

Please refer to FIG. 11. The photoelectric device package 1100 of this embodiment further includes a reflective layer 1185. The reflective layer 1185 is located on the first encapsulation layer 170 and covers the third surface 260c. In this way, in the photoelectric device package 1100 having a bottom-emitting structure, its luminance may be enhanced by the reflective layer 1185.

Figure 12:
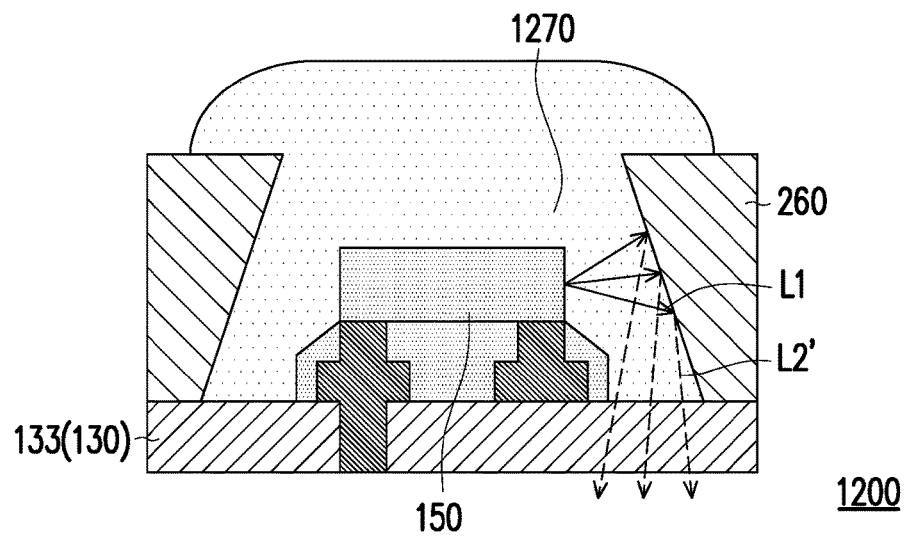
FIG. 12 is a partial cross-sectional view of a photoelectric device package according to a twelfth embodiment of this disclosure.

FIG. 12 is a partial cross-sectional view of a photoelectric device package according to a twelfth embodiment of this disclosure. The photoelectric device package 1200 of the twelfth embodiment is similar to the photoelectric device package 700 of FIG. 7. This embodiment will be described with reference to the photoelectric device package 1200 with reference to FIG. 12. In FIG. 12, the same or similar reference numerals denote the same or similar components, and therefore, the components for the components illustrated in FIG. 7 are not described again herein.

Please refer to FIG. 12. The first encapsulation layer 1270 of the photoelectric device package 1200 of this embodiment may include a photon conversion material. For example, if the aforementioned light converting material is an upconversion material, the frequency of a part of the second light beam L2' may be greater than the frequency of the first light beam L1. On the other hand, if the aforementioned light converting material is a downconversion material, the frequency of a part of the second light beam L2' may be smaller than the frequency of the first light beam L1.

Figure 13:
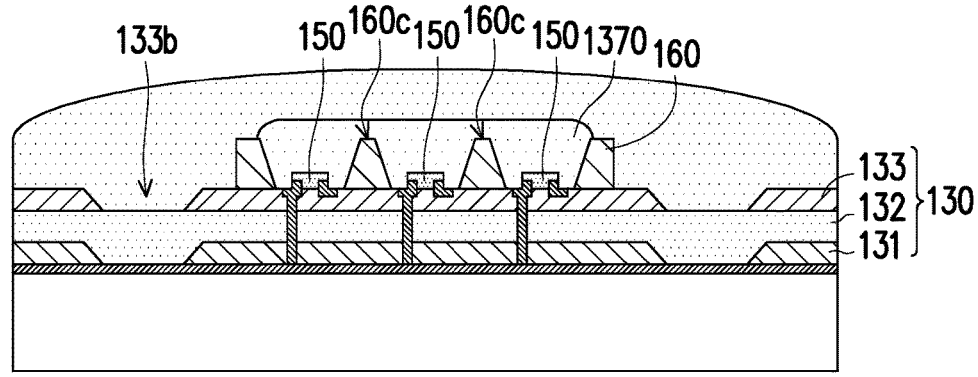
FIG. 13 is a partial cross-sectional view of a photoelectric device package according to a thirteenth embodiment of this disclosure.

FIG. 13 is a partial cross-sectional view of a photoelectric device package according to a thirteenth embodiment of this disclosure. The photoelectric device package 1300 of the thirteenth embodiment is similar to the photoelectric device package 100 of FIGS. 1H-1J, and this embodiment will be described with respect to the photoelectric device package 1300 using FIG. 13. In FIG. 13, the same or similar reference signs denote the same or similar components, and therefore, the components described with respect to FIGS. 1H-1J, are not described herein again.

Please refer to FIG. 13. The number of the photoelectric devices 150 of the photoelectric device package 1300 of this embodiment is plural, the first encapsulation layer 1370 covers the plurality of photoelectric devices 150, and the first encapsulation layer 1370 completely covers the adjacent two photoelectric devices 150 on the third surface 160c.

Figure 14:
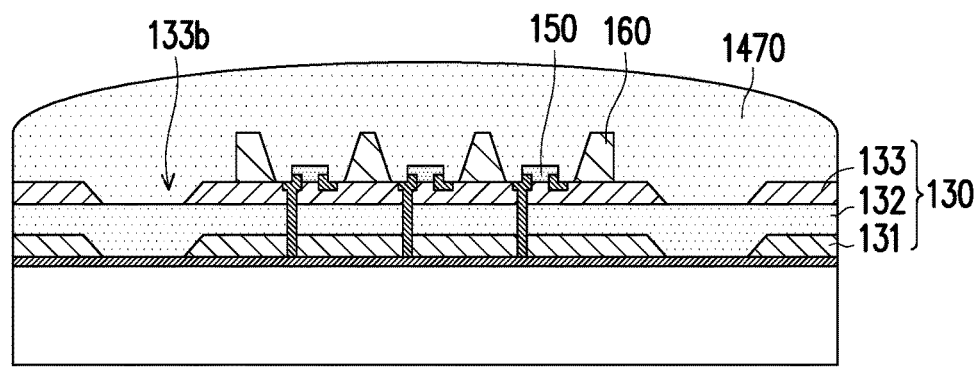
FIG. 14 is a partial cross-sectional view of a photoelectric device package according to a fourteenth embodiment of this disclosure.

FIG. 14 is a partial cross-sectional view of a photoelectric device package according to a fourteenth embodiment of this disclosure. The photoelectric device package 1400 of the fourteenth embodiment is similar to the photoelectric device package 1300 of FIG. 13, and this embodiment will be described with reference to the photoelectric device package 1400 using FIG. 14. In FIG. 14, the same or similar reference numerals denote the same or similar components, and therefore, the components for the components illustrated in FIG. 13 are not described herein again.

Referring to FIG. 14, the first encapsulation layer 1470 of the photoelectric device package 1400 of this embodiment completely covers the light output part 160 and covers the elastic layer 132 exposed by the second grooves 133b.

Figure 15:
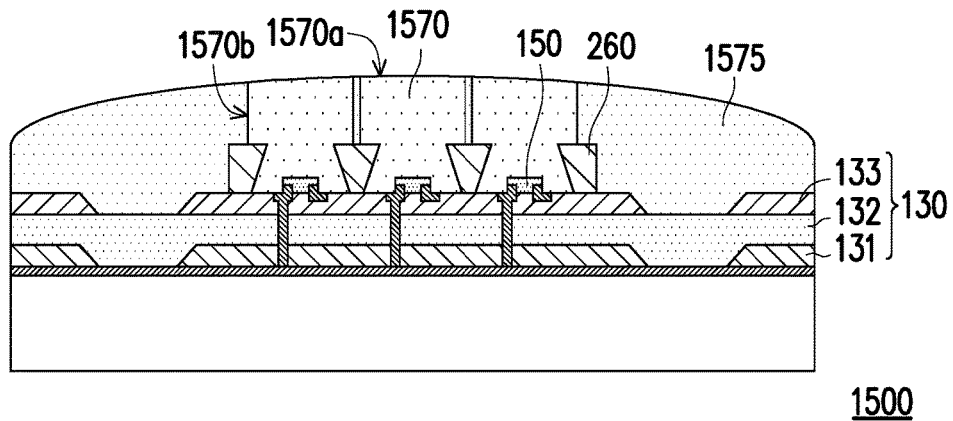
FIG. 15 is a partial cross-sectional view of a photoelectric device package according to a fifteenth embodiment of this disclosure.

FIG. 15 is a partial cross-sectional view of a photoelectric device package according to a fifteenth embodiment of this disclosure. The photoelectric device package 1500 of the fifteenth embodiment is similar to the photoelectric device package 200 of FIG. 2, and this embodiment will be described with reference to the photoelectric device package 1500 using FIG. 15. In FIG. 15, the same or similar reference numerals denote the same or similar components, and therefore, the components described with respect to FIG. 2 are not described herein again.

Please refer to FIG. 15. The second encapsulation layer 1575 of the photoelectric device package 1500 in this embodiment laterally covers the side surface 1570b of the first encapsulation layer 1570, and the second encapsulation layer 1575 does not cover the upper surface 1570a of the first encapsulation layer 1570.

In some embodiments, the first encapsulation layer 1570 and the second encapsulation layer 1575 may be formed of the same material. The first encapsulation layer 1570 may be patterned by ultraviolet light irradiation, chemical means, physical means, heating means or the like in such a manner that the Young's modulus of the second encapsulation layer 1575 may be smaller than the Young's modulus of the first encapsulation layer 1570 to enhance the bending or flexing ability of the photoelectric device package 1500.

Figure 16:
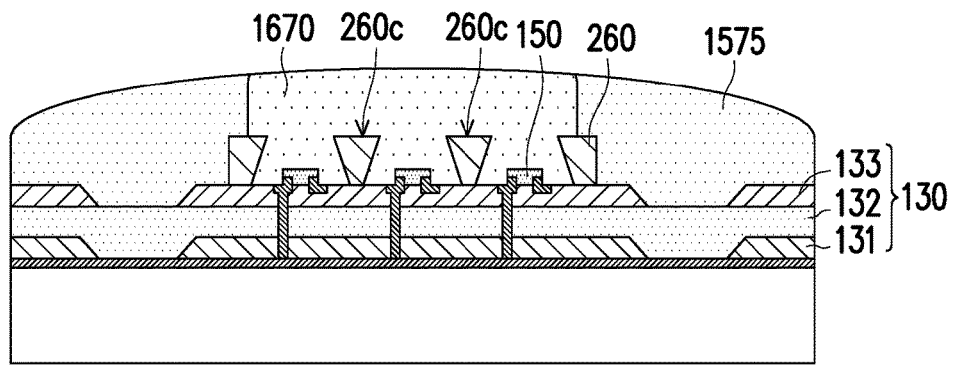
FIG. 16 is a partial cross-sectional view of a photoelectric device package according to a sixteenth embodiment of this disclosure.

FIG. 16 is a partial cross-sectional view of a photoelectric device package according to a sixteenth embodiment of this disclosure. The photoelectric device package 1600 of the sixteenth embodiment is similar to the photoelectric device package 1500 of FIG. 15, and this embodiment will be described with respect to the photoelectric device package 1600 using FIG. 16. It n FIG. 16, the same or similar reference numerals denote the same or similar components, and therefore, the components described with reference to FIG. 15 are not described herein again.

In some embodiments, the first encapsulation layer 1670 and the second encapsulation layer 1575 may be formed of the same material. The first encapsulation layer 1670 may be patterned by ultraviolet light irradiation, chemical means, physical means, heating means or the like in such a manner that the Young's modulus of the second encapsulation layer 1575 may be smaller than the Young's modulus of the first encapsulation layer 1670 to enhance the bending or flexing ability of the photoelectric device package 1600.

Please refer to FIG. 16. The number of the photoelectric devices 150 of the photoelectric device package 1600 of this embodiment is plural, the first encapsulation layer 1670 covers the photoelectric devices 150, and the first encapsulation layer 1670 completely covers the adjacent two photoelectric devices 150 of the third surfaces 260c.

Figure 17:
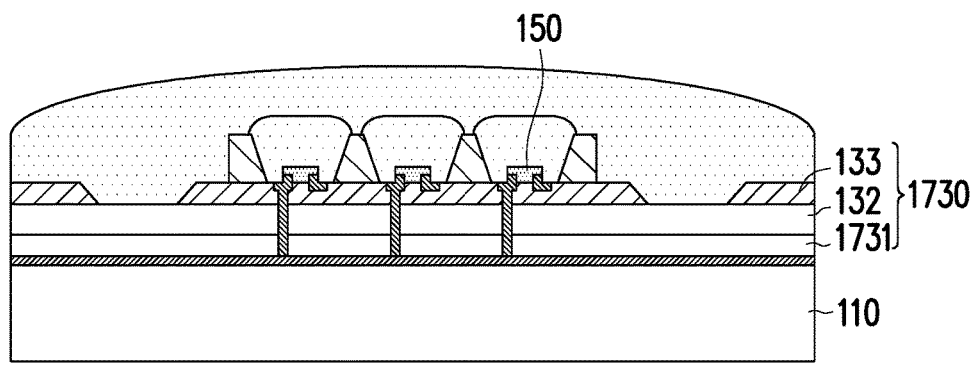
FIG. 17 is a partial cross-sectional view of a photoelectric device package according to a seventeenth embodiment of this disclosure.

FIG. 17 is a schematic partial cross-sectional view of a photoelectric device package according to a seventeenth embodiment of this disclosure. The photoelectric device package 1700 of the seventeenth embodiment is similar to the photoelectric device package 100 of FIGS. 1H-1J, and this embodiment will be described with respect to the photoelectric device package 1700 using FIG. 17. In FIG. 17, the same or similar reference numerals denote the same or similar components, and therefore, the components described with reference to FIGS. 1H-1J are not described herein again.

Referring to FIG. 17, the first dielectric layer 1731 of the carrier structure 1730 of the photoelectric device package 1700 of this embodiment may completely cover the first substrate 110.

Figure 18:
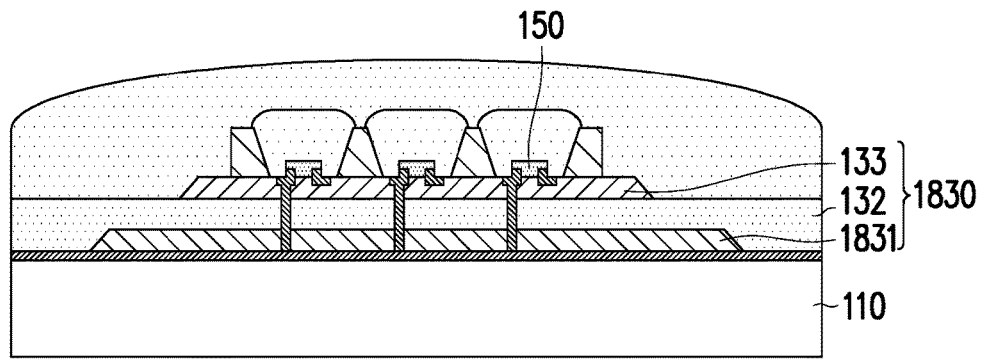
FIG. 18 is a partial cross-sectional view of a photoelectric device package according to an eighteenth embodiment of this disclosure.

FIG. 18 is a schematic partial cross-sectional view of a photoelectric device package according to an eighteenth embodiment of this disclosure. The photoelectric device package 1800 of the eighteenth embodiment is similar to the photoelectric device package 100 of FIGS. 1H-1J, and this embodiment will be described with respect to the photoelectric device package 1800 using FIG. 18. In FIG. 18, the same or similar reference numerals denote the same or similar components, and therefore, the components described with reference to FIGS. 1H-1J are not described herein again.

Please refer to FIG. 18. In the carrier structure 1830, the first dielectric layer 1831 and the second dielectric layer 133 may be correspondingly arranged, and the area of the first dielectric layer 1831 is larger than the area of the second dielectric layer 133 in the photoelectric device package 1800 of this embodiment.

Figure 19:
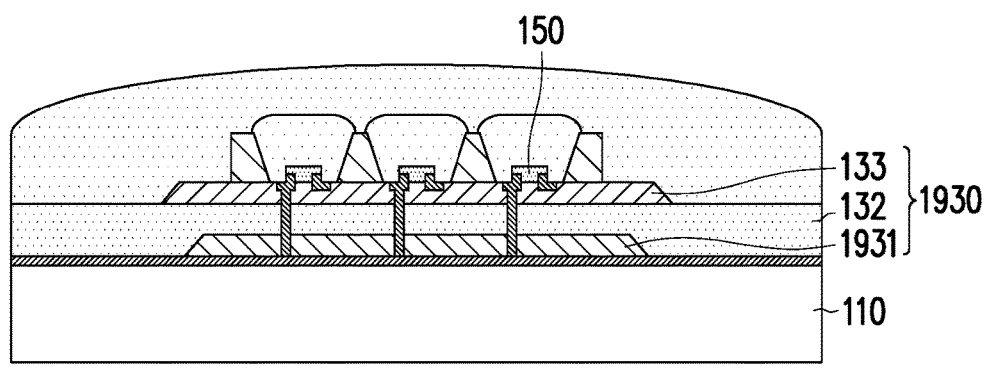
FIG. 19 is a partial cross-sectional view of a photoelectric device package according to a nineteenth embodiment of this disclosure.

FIG. 19 is a schematic partial cross-sectional view of a photoelectric device package according to a nineteenth embodiment of this disclosure. The photoelectric device package 1900 of the nineteenth embodiment is similar to the photoelectric device package 100 of FIGS. 1H-1J, and this embodiment will be described with respect to the photoelectric device package 1900 using FIG. 19. In FIG. 19, the same or similar reference numerals denote the same or similar components, and therefore, the components described with reference to FIGS. 1H-1J are not described herein again.

Please refer to FIG. 19. In the carrier structure 1930, the first dielectric layer 1931 and the second dielectric layer 133 may be correspondingly disposed in the photoelectric device package 1900 of this embodiment, and the area of the first dielectric layer 1931 is smaller than that of the second dielectric layer 133 in the photoelectric device package 1900 of this embodiment.

Figure 20:
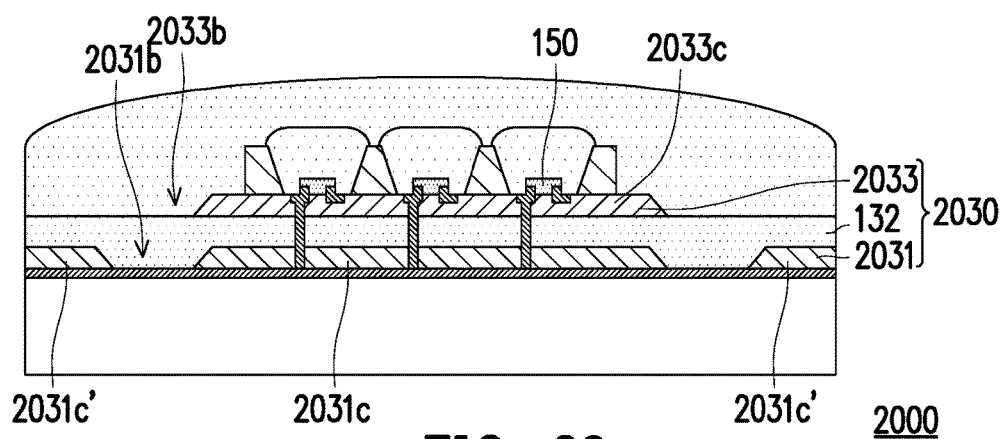
FIG. 20 is a partial cross-sectional view of a photoelectric device package according to a twentieth embodiment of this disclosure.

FIG. 20 is a schematic partial cross-sectional view of a photoelectric device package according to a twentieth embodiment of this disclosure. The photoelectric device package 2000 of the twentieth embodiment is similar to the photoelectric device package 100 of FIGS. 1H-1J, and this embodiment will be described with respect to the photoelectric device package 2000 using FIG. 20. In FIG. 20, the same or similar reference numerals denote the same or similar components, and therefore, the components described with reference to FIGS. 1H-1J are not described herein again.

Please refer to FIG. 20. In the carrier structure 2030, the first dielectric layer 2031 form a plurality of first dielectric portions 2031c and 2031c' separated from each other by the first grooves 2031b, the second dielectric layer 2033 may form a plurality of second dielectric portions 2033c separated from each other by the second grooves 2033b, the number of first dielectric portions 2031c and 2031c' is greater than the number of second dielectric portions 2033c in the photoelectric device package 2000 of this embodiment. In this embodiment, the second dielectric portion 2033c corresponds to at least some of the first dielectric portion 2031c, and some of the first dielectric portion 2031c' is located between two adjacent first dielectric portions 2031c.

Figure 21:
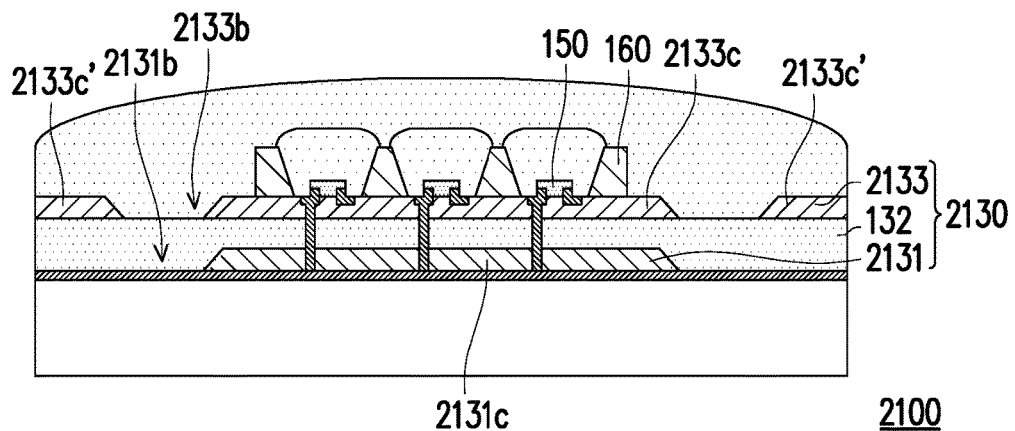
FIG. 21 is a partial cross-sectional view of a photoelectric device package according to a twenty-first embodiment of this disclosure.

FIG. 21 is a schematic partial cross-sectional view of a photoelectric device package according to a twenty-first embodiment of this disclosure. The photoelectric device package 2100 of the twenty-first embodiment is similar to the photoelectric device package 100 of FIGS. 1H-1J, and this embodiment will be described with respect to the photoelectric device package 2100 using FIG. 21. In FIG. 21, the same or similar reference numerals denote the same or similar components, and therefore, the components described with reference to FIGS. 1H-1J are not described herein again.

Please refer to FIG. 21. In the carrier structure 2130, the first dielectric layer 2131 may form a plurality of first dielectric portions 2131c separated from each other by the first grooves 2131b, the second dielectric layer 2133 may form a plurality of second dielectric portions 2133c and 2133c' separated from each other by the second grooves 2133b, the number of first dielectric portions 2131c is less than the number of second dielectric portions 2133c and 2133c' in the photoelectric device package 2100 of this embodiment. In the present embodiment, the first dielectric portions 2131c corresponds to at least some of the second dielectric portions 2133c. In addition, the second dielectric portions 2133c' not corresponding to the first dielectric portions 2131c are located between two adjacent second dielectric portions 2133c, and the photoelectric devices 150 and the light output parts 160 may be disposed to correspond to the first dielectric portion 2131c.

Figure 22A:
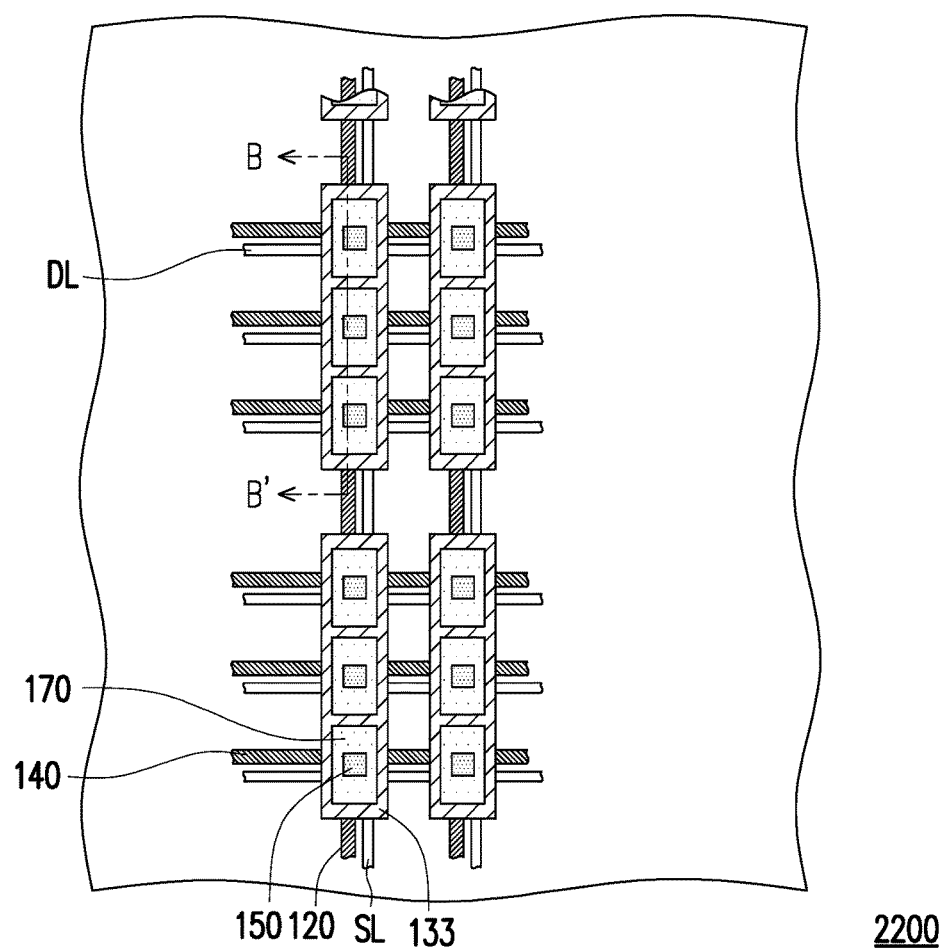
FIG. 22A is a schematic partial top view of a photoelectric device package according to a twenty-second embodiment of this disclosure.
Figure 22B:
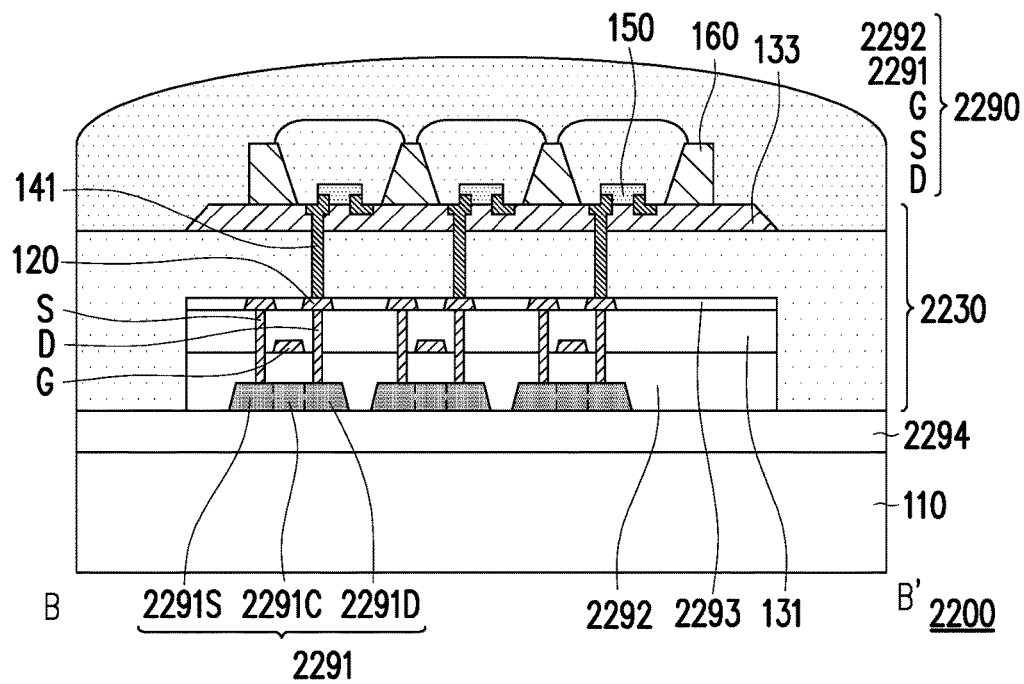
FIG. 22B is a partial cross-sectional view of a photoelectric device package according to a twenty-second embodiment of this disclosure.

FIG. 22A is a schematic partial top view of a photoelectric device package according to a twenty-second embodiment of this disclosure. FIG. 22B is a partial cross-sectional view of a photoelectric device package according to a twenty-second embodiment of this disclosure. For clarity, some of the layers and components are omitted from FIG. 22A. The photoelectric device package 2200 of the twenty-second embodiment is similar to the photoelectric device package 100 of FIGS. 1H-1J, and the present embodiment will be described with respect to the photoelectric device package 2200 in FIGS. 22A and 22B. In FIGS. 22A and 22B, the same or similar reference numerals denote the same or similar components, and therefore, the components described with reference to FIGS. 1H-1J are not described herein again.

Please refer to FIGS. 22A and 22B at the same time. In this embodiment, the carrier structure 2230 further comprises active devices 2290. Each of the active devices 2290 includes a semiconductor layer 2291, a gate G, a gate dielectric layer 2292, a source S, and a drain D. The semiconductor layer 2291 may be located on the first substrate 110 and have a source region 2291S, a channel region 2291C, and a drain region 2291D, and the channel region 2291C is located between the source region 2291S and the drain region 2291D. The source S and the drain D are respectively coupled to the source region 2291S and the drain region 2291D of the semiconductor layer 2291. The gate G is disposed on the first substrate 110 and corresponding to the channel region 2291C of the semiconductor layer 2291. The gate dielectric layer 2292 is located between the gate G and the semiconductor layer 2291, and the first dielectric layer 131 covers the gate dielectric layer 2292 and the gate G. In this embodiment, the semiconductor layer 2291 is located between the first substrate 110 and the gate G. In other words, the active device 2290 of the present embodiment may be a thin film transistor having a top gate structure, but the present disclosure is not limited thereto. In addition, the active devices 2290 may be formed by a general semiconductor process, and will not be described in detail herein.

In this embodiment, the photoelectric device package 2200 further includes scan lines SL and data lines DL. The sources S are electrically connected to the data lines DL. The gates G are electrically connected to the scan lines SL. The drains D are electrically connected to the photoelectric devices 150 via a portion of the first circuit layer 120 (ie, the portion of the first circuit layer 120 connected to the conductive vias 141) and the conductive vias 141. The photoelectric devices 150 are driven by the active devices 2290 to emit light. That is, the photoelectric device package 2200 of the present embodiment may be an active mode light-emitting device, but the present disclosure is not limited thereto.

In this embodiment, a passivation layer 2293 may be disposed between the first dielectric layer 131 and the elastic layer 132. The passivation layer 2293, the gate dielectric layer 2292 and the first dielectric layer 131 may have similar patterns, but this disclosure is not limited thereto.

In this embodiment, a buffer layer 2294 may be formed on the first substrate 110. The buffer layer 2294 may have a good bonding force or a lower water vapor transmission rate (WVTR) to improve the reliability of the photoelectric device package 2200.

Figure 23:
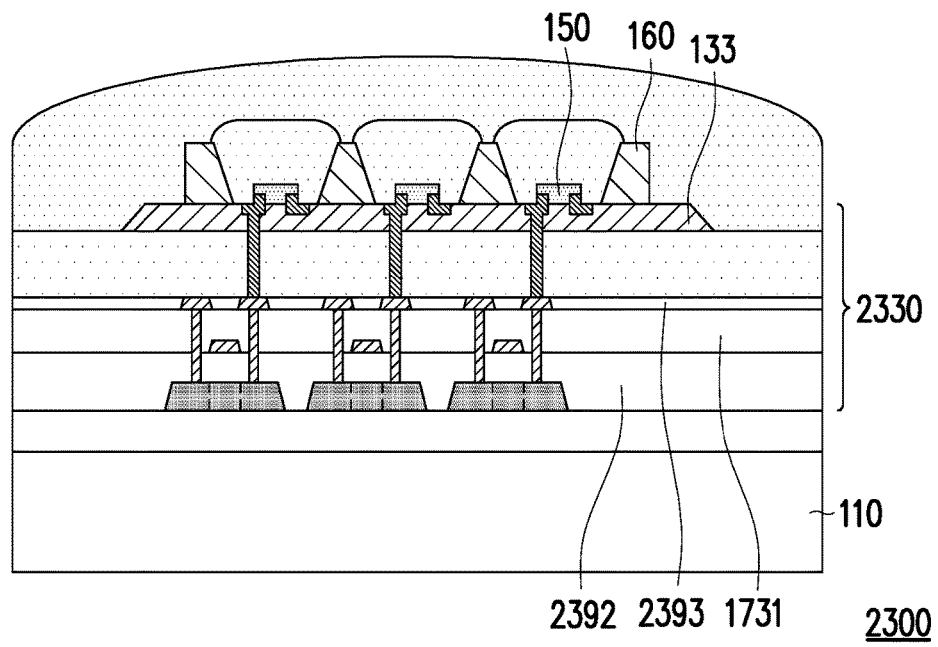
FIG. 23 is a partial cross-sectional view of a photoelectric device package according to a twenty-third embodiment of this disclosure.

FIG. 23 is a partial cross-sectional view of a photoelectric device package according to a twenty-third embodiment of the present disclosure. The photoelectric device package 2300 of the twenty-third embodiment is similar to the photoelectric device package 2200 of FIGS. 22A and 22B, and the present embodiment will be described with respect to the photoelectric device package 2300 using FIG. 23. In FIG. 23, the same or similar reference numerals denote the same or similar components, and therefore, the components described with reference to FIGS. 22A and 22B are not described herein again.

Please refer to FIG. 23. In the carrier structure 2330, the passivation layer 2393, the gate dielectric layer 2392, and the first dielectric layer 1731 may completely cover the first substrate 110 in the photoelectric device package 2300 of this embodiment.

Figure 24:
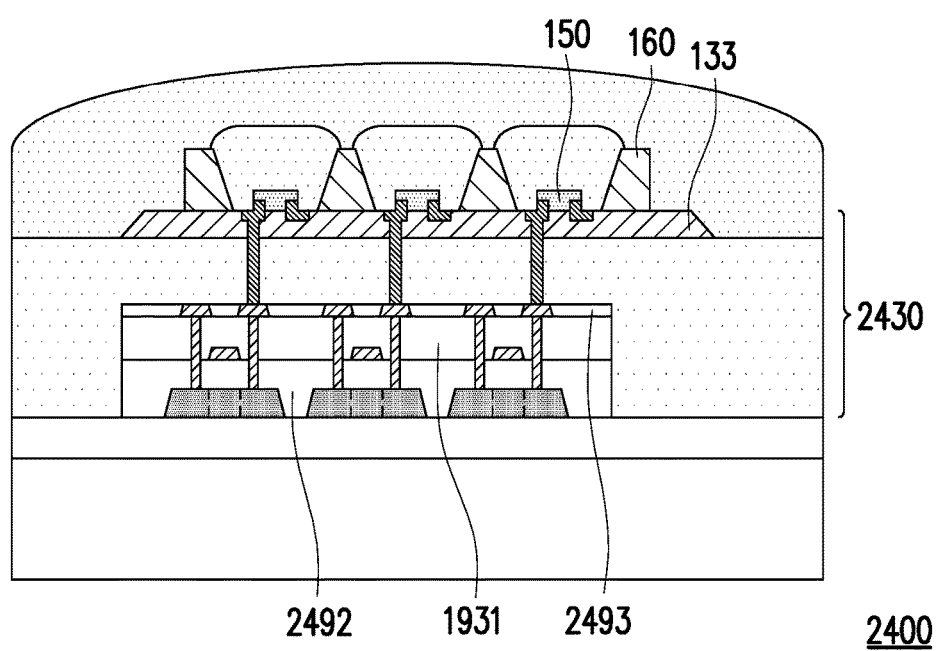
FIG. 24 is a partial cross-sectional view of a photoelectric device package according to a twenty-fourth embodiment of this disclosure.

FIG. 24 is a partial cross-sectional view of a photoelectric device package according to a twenty-fourth embodiment of the present disclosure. The photoelectric device package 2400 of the twenty-fourth embodiment is similar to the photoelectric device package 2200 of FIGS. 22A and 22B, and the present embodiment will be described with respect to the photoelectric device package 2400 using FIG. 24. In FIG. 24, the same or similar reference numerals denote the same or similar components, and therefore, the components described with reference to FIGS. 22A and 22B are not described herein again.

Please refer to FIG. 24. In the carrier structure 2430, the areas of the passivation layer 2493, the gate dielectric layer 2492, and the first dielectric layer 1931 may be smaller than the area of the second dielectric layer 133 in the photoelectric device package 2400 of this embodiment.

Figure 25:
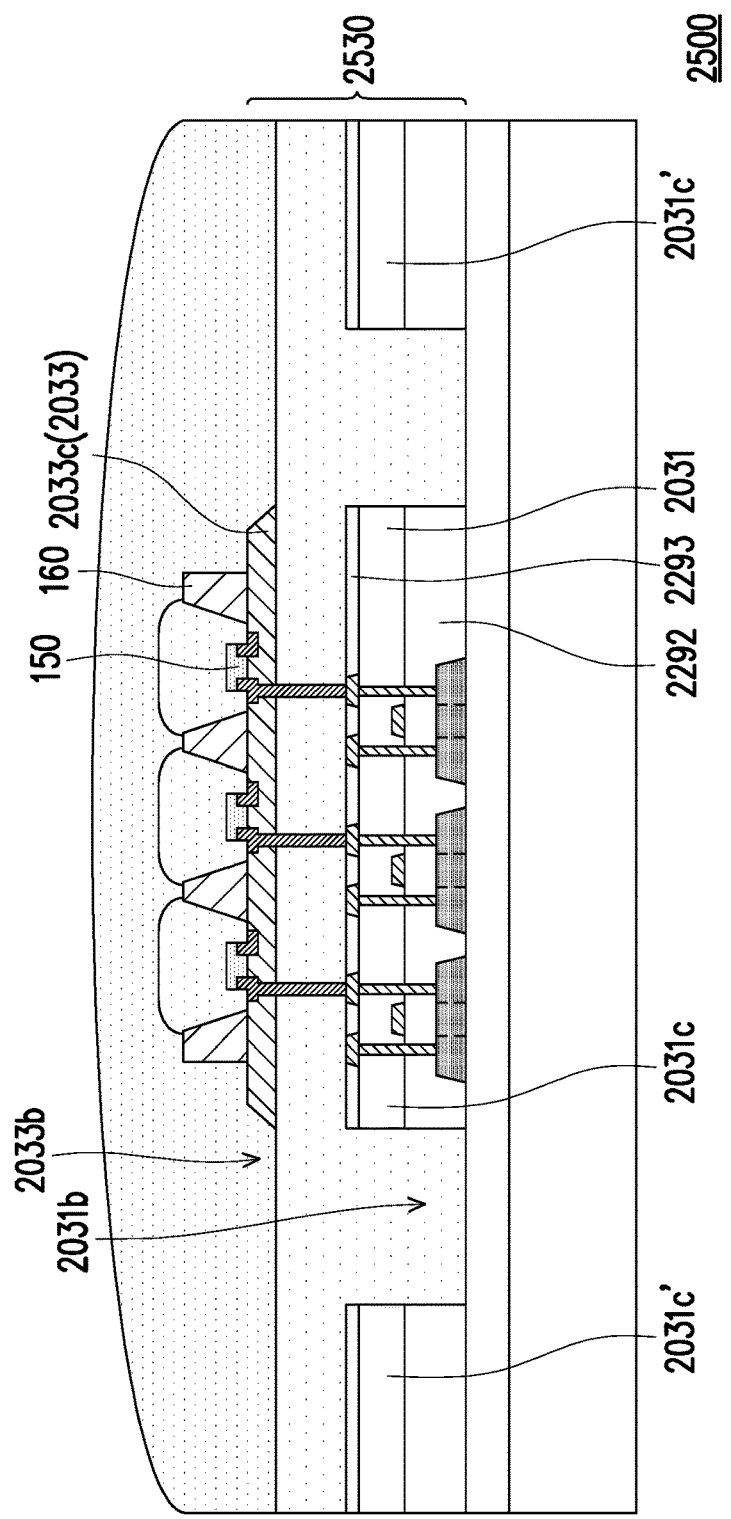
FIG. 25 is a partial cross-sectional view of a photoelectric device package according to a twenty-fifth embodiment of this disclosure.

FIG. 25 is a schematic partial cross-sectional view of a photoelectric device package according to a twenty-fifth embodiment of the present disclosure. The photoelectric device package 2500 of the twenty-fifth embodiment is similar to the photoelectric device package 2200 of FIGS. 22A and 22B, and the present embodiment will be described with respect to the photoelectric device package 2500 using FIG. 25. In FIG. 25, the same or similar reference numerals denote the same or similar components, and therefore, the components described with reference to FIGS. 22A and 22B are not described herein again.

Please refer to FIG. 25. In the carrier structure 2530, the first dielectric layer 2031 may form a plurality of first dielectric portions 2031c and 2031c' separated from each other by the first grooves 2031b, the second dielectric layer 2033 may form a plurality of second dielectric portions 2033c separated from each other by the second grooves 2033b, the number of first dielectric portions 2031c and 2031c' is greater than the number of second dielectric portions 2033c in the photoelectric device package 2500 of this embodiment. In this embodiment, the second dielectric portions 2033c correspond to at least some of the first dielectric portions 2031c, and some of the first dielectric portions 2031c' are disposed between two adjacent first dielectric portions 2031c. The gate dielectric layer 2292 and the passivation layer 2293 are disposed to be corresponding to the first dielectric layer 2031.

Figure 26:
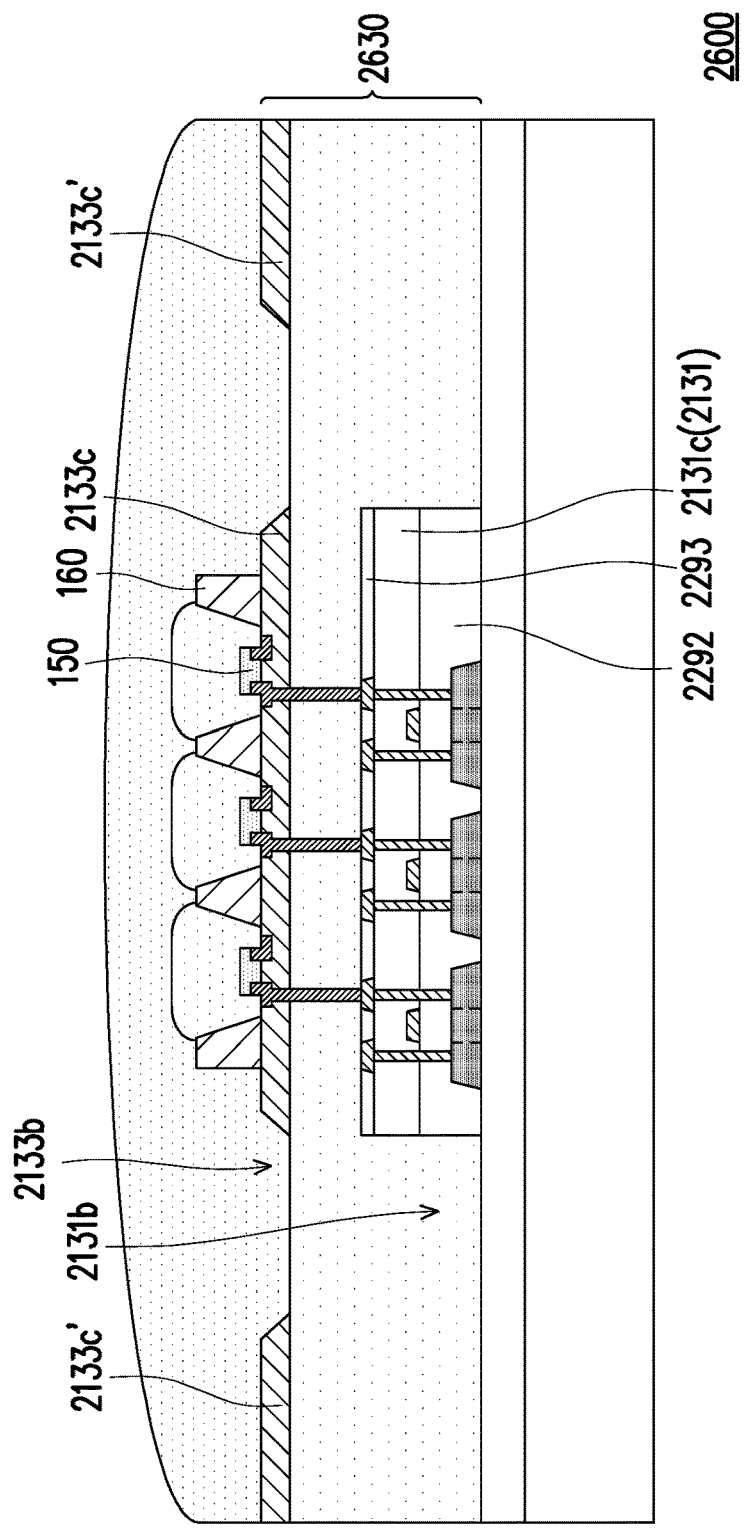
FIG. 26 is a partial cross-sectional view of a photoelectric device package according to a twenty-sixth embodiment of this disclosure.

FIG. 26 is a partial cross-sectional view of a photoelectric device package according to a twenty-sixth embodiment of the present disclosure. The photoelectric device package 2600 of the twenty-sixth embodiment is similar to the photoelectric device package 2200 of FIGS. 22A and 22B, and the present embodiment will be described with respect to the photoelectric device package 2600 using FIG. 26. In FIG. 26, the same or similar reference numerals denote the same or similar components, and therefore, the components described with reference to FIGS. 22A and 22B are not described herein again.

Please refer to FIG. 26. In the carrier structure 2630, the first dielectric layer 2131 may form a plurality of first dielectric portions 2131c separated from each other by the first grooves 2131b, the second dielectric layer 2133 may form a plurality of second dielectric portions 2133c and 2133c' separated from each other by the second grooves 2133b, the number of first dielectric portions 2131c is less than the number of second dielectric portions 2133c and 2133c' in the photoelectric device package 2600 of this embodiment. In the present embodiment, the first dielectric portions 2131c correspond to at least some of the second dielectric portions 2133c. In addition, the second dielectric portions 2133c' not corresponding to the first dielectric portion 2131c are located between two adjacent second dielectric portions 2133c, and the photoelectric devices 150 and the light output parts 160 are disposed to correspond to the first dielectric portions 2131c. The gate dielectric layer 2292 and the passivation layer 2293 are disposed to be corresponding to the first dielectric layer 2131.

Figure 27:
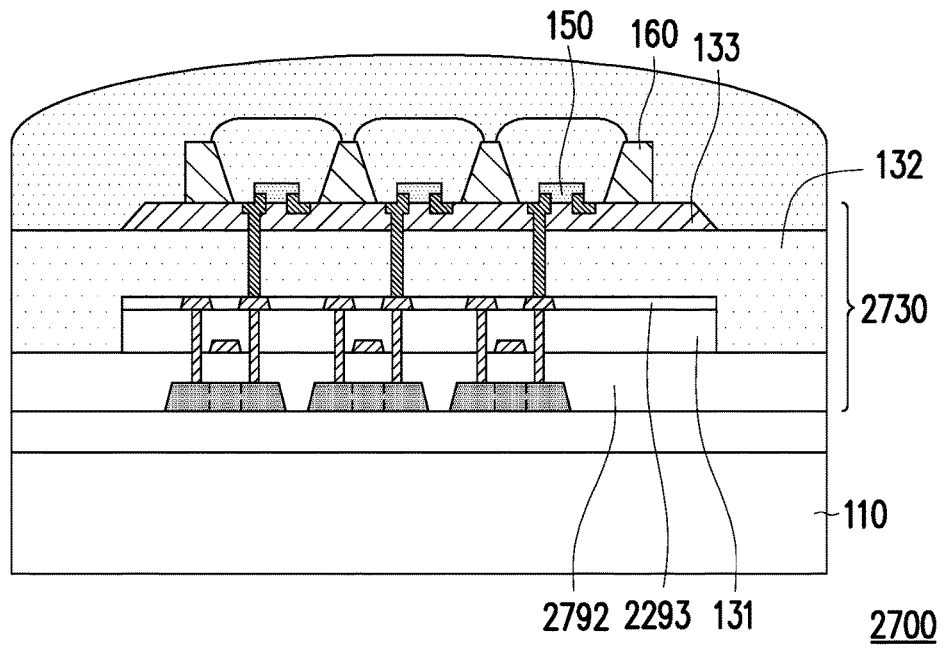
FIG. 27 is a partial cross-sectional view of a photoelectric device package according to a twenty-seventh embodiment of this disclosure.

FIG. 27 is a partial cross-sectional view of a photoelectric device package according to a twenty-seventh embodiment of the present disclosure. The photoelectric device package 2700 of the twenty-seventh embodiment is similar to the photoelectric device package 2200 of FIGS. 22A and 22B, and the present embodiment will be described with respect to the photoelectric device package 2700 using FIG. 27. In FIG. 27, the same or similar reference numerals denote the same or similar components, and therefore, the components described with reference to FIGS. 22A and 22B are not described herein again.

Please refer to FIG. 27. In the carrier structure 2730, the gate dielectric layer 2792 may completely cover the first substrate 110, the passivation layer 2293 and the first dielectric layer 131 may have similar patterns in the photoelectric device package 2700 of this embodiment.

Figure 28:
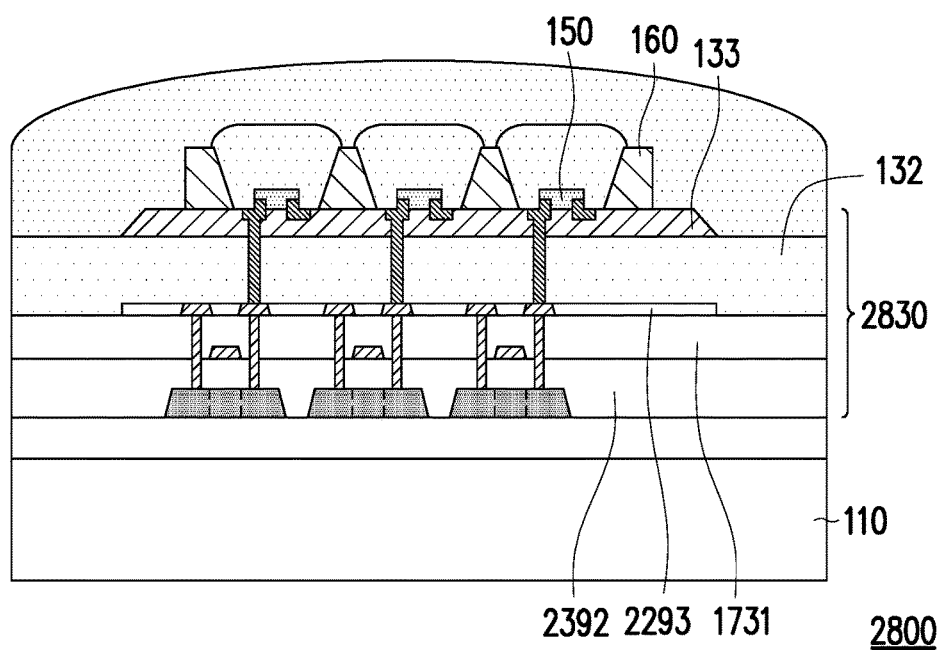
FIG. 28 is a partial cross-sectional view of a photoelectric device package according to a twenty-eighth embodiment of this disclosure.

FIG. 28 is a partial cross-sectional view of a photoelectric device package according to a twenty-eighth embodiment of the present disclosure. The photoelectric device package 2800 of the twenty-eighth embodiment is similar to the photoelectric device package 2200 of FIGS. 22A and 22B, and the present embodiment will be described with respect to the photoelectric device package 2800 using FIG. 28. In FIG. 28, the same or similar reference numerals denote the same or similar components, and therefore, the components described with reference to FIGS. 22A and 22B are not described herein again.

Please refer to FIG. 28. In the carrier structure 2830, the gate dielectric layer 2392 and the first dielectric layer 1731 may completely cover the first substrate 110, the passivation layer 2293 is disposed to be corresponding to the second dielectric layer 133 and may have a similar pattern as the second dielectric layer 133 in the photoelectric device package 2800 of this embodiment.

Figure 29:
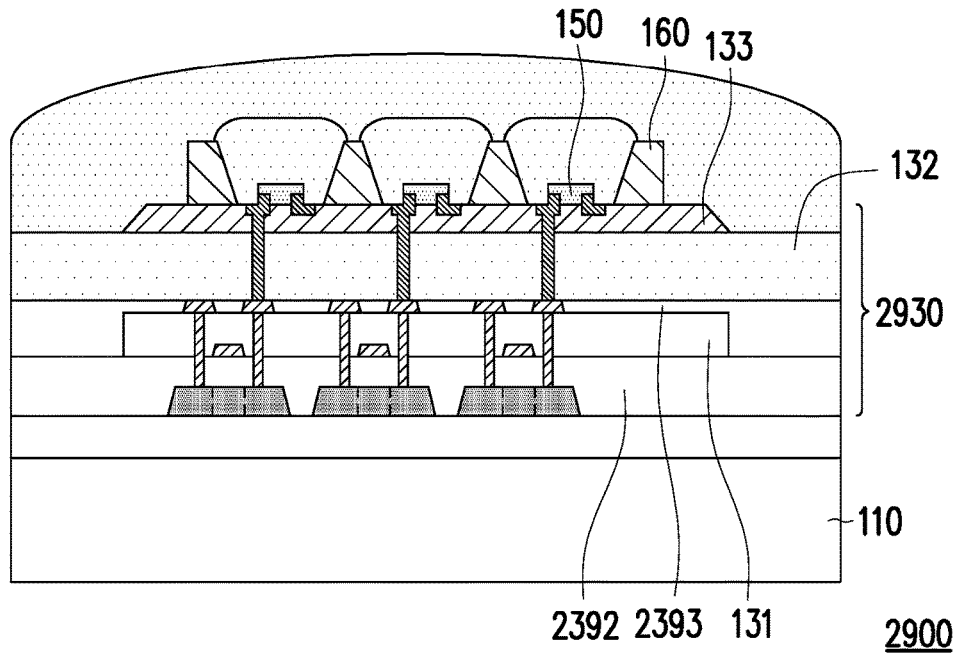
FIG. 29 is a partial cross-sectional view of a photoelectric device package according to a twenty-ninth embodiment of this disclosure.

FIG. 29 is a schematic partial cross-sectional view of a photoelectric device package according to a twenty-ninth embodiment of the present disclosure. The photoelectric device package 2900 of the twenty-ninth embodiment is similar to the photoelectric device package 2200 of FIGS. 22A and 22B, and the present embodiment will be described with respect to the photoelectric device package 2900 using FIG. 29. In FIG. 29, the same or similar reference numerals denote the same or similar components, and therefore, the components described with reference to FIGS. 22A and 22B are not described herein again.

Please refer to FIG. 29. In the carrier structure 2930, the gate dielectric layer 2392 and the passivation layer 2393 may completely cover the first substrate 110, the passivation layer 2393 covers the gate dielectric layer 2392 that is not covered by the first dielectric layer 131 in the photoelectric device package 2900 of this embodiment.

Figure 30:
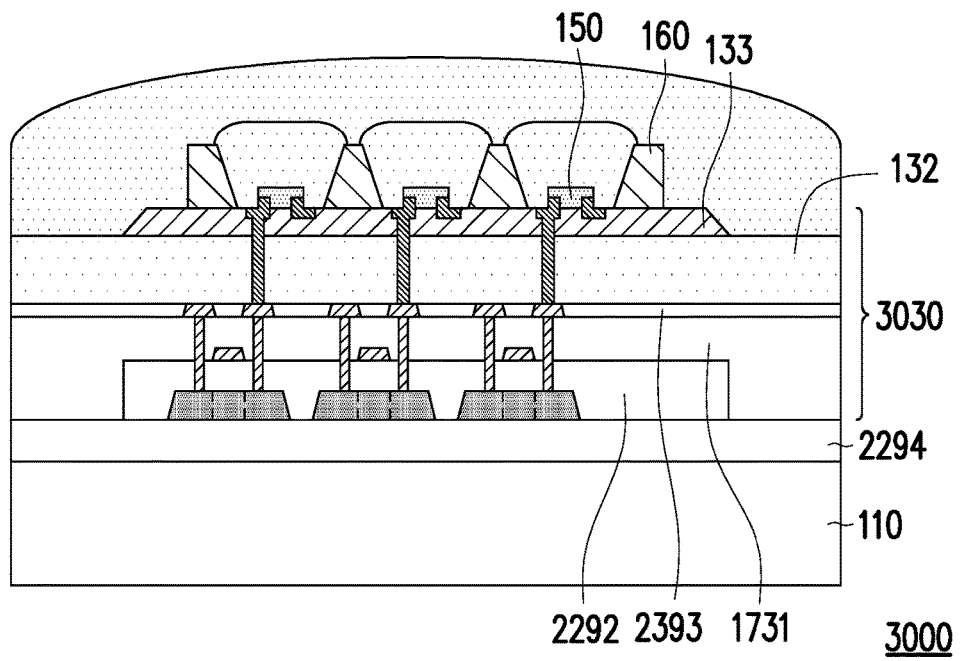
FIG. 30 is a partial cross-sectional view of a photoelectric device package according to a thirtieth embodiment of this disclosure.

FIG. 30 is a schematic partial cross-sectional view of a photoelectric device package according to a thirtieth embodiment of the present disclosure. The photoelectric device package 3000 of the thirtieth embodiment is similar to the photoelectric device package 2200 of FIGS. 22A and 22B, and this embodiment will be described with respect to the photoelectric device package 3000 using FIG. 30. In FIG. 30, the same or similar reference numerals denote the same or similar components, and therefore, the components described with reference to FIGS. 22A and 22B are not described herein again.

Please refer to FIG. 30. In the carrier structure 3030, the passivation layer 2393 and the first dielectric layer 1731 may completely cover the first substrate 110, the first dielectric layer 1731 covers the buffer layer 2294 that is not covered by the gate dielectric layer 2292 in the photoelectric device package 3000 of this embodiment. The gate dielectric layer 2292 is disposed to be corresponding to the second dielectric layer 133 and may have a similar pattern as the second dielectric layer 133.

Figure 31:
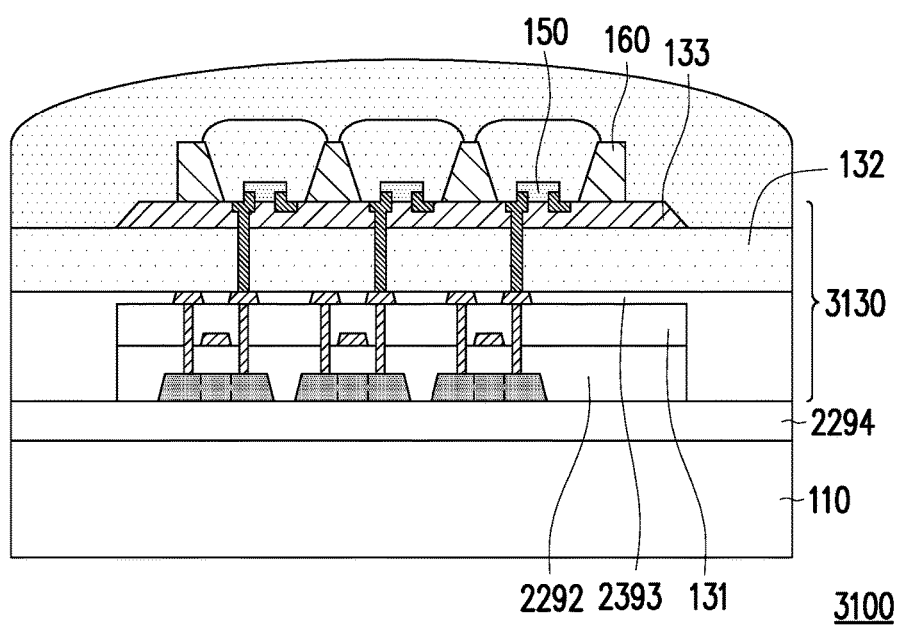
FIG. 31 is a partial cross-sectional view of a photoelectric device package according to a thirty-first embodiment of this disclosure.

FIG. 31 is a schematic partial cross-sectional view of a photoelectric device package 3100 according to a thirty-first embodiment of the present disclosure. The photoelectric device package 3100 of the thirty-first embodiment is simi-lar to the photoelectric device package 2200 of FIGS. 22A and 22B, and the present embodiment will be described with respect to the photoelectric device package 3100 using FIG. 31. In FIG. 31, the same or similar reference numerals denote the same or similar components. Therefore, the components described with reference to FIGS. 22A and 22B are not described herein again.

Please refer to FIG. 31. In the carrier structure 3130, the passivation layer 2393 may completely cover the first substrate 110, the passivation layer 2393 covers the buffer layer 2294 that is not covered by the first dielectric layer 131 and the gate dielectric layer 2292 in the photoelectric device package 3100 of this embodiment.

According to some embodiments of this disclosure, the photoelectric device package may include a carrier structure. The carrier structure comprises a first dielectric layer, an elastic layer and a second dielectric layer, and the first dielectric layer and the second dielectric layer at least have a plurality of grooves. In this way, the carrier structure may absorb or buffer stress when the package is stressed to reduce the stress applied to the positions carrying photoelectric devices. Therefore, the flex resistance of the photoelectric device package may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photoelectric device package, comprising:
   a first circuit layer on a first substrate;
   a carrier structure on the first substrate and covering the first circuit layer, the carrier structure comprises a first dielectric layer, an elastic layer, and a second dielectric layer, wherein the elastic layer is disposed between the first dielectric layer and the second dielectric layers, and the Young's modulus of the elastic layer is less than the Young's modulus of the first dielectric layer and the second dielectric layer;
   a second circuit layer on the carrier structure;
   at least one photoelectric device disposed on the carrier structure and electrically connecting to the first circuit layer and the second circuit layer; and
   a first encapsulation layer disposed on the carrier structure and encapsulating the at least one photoelectric device.

2. The photoelectric device package of claim 1, further comprising at least one conductive via penetrating at least the elastic layer and the second dielectric layer of the carrier structure, wherein the at least one photoelectric device is connected to the first circuit layer through the at least one conductive via.

3. The photoelectric device package of claim 1, wherein the first substrate comprises a plurality of substrate openings, and the first dielectric layer or the second dielectric layer do not overlap with the substrate openings.

4. The photoelectric device package of claim 3, wherein the elastic layer is filled in the substrate openings.

5. The photoelectric device package of claim 1, wherein the first dielectric layer has a plurality of first grooves, and the elastic layer is filled in the first grooves.

6. The photoelectric device package of claim 1, wherein the second dielectric layer has a plurality of second grooves.

7. The photoelectric device package of claim 1, further comprising at least one light guide structure on the carrier structure and surrounding the at least one photoelectric device, wherein the first encapsulation layer fills the area enclosed by the at least one light guide structure.

8. The photoelectric device package of claim 7, wherein the at least one light guide structure has at least a first surface, a second surface and a third surface, wherein the first surface faces the carrier structure, the second surface faces the at least one photoelectric device, and the second surface is connected to the first surface and the third surface.

9. The photoelectric device package of claim 8, wherein the first surface is not adjacent to the third surface, and the area of the first surface is greater than the area of the third surface, and wherein the at least one light guide structure comprises a light output part, and the light output part has a refractive index greater than the refractive index of the first encapsulation layer.

10. The photoelectric device package of claim 8, wherein the first surface is not adjacent to the third surface, and the area of the first surface is smaller than the area of the third surface, and wherein the at least one light guide structure comprises a light output part, and the light output part has a refractive index smaller than the refractive index of the first encapsulation layer.

11. The photoelectric device package of claim 8, wherein the first encapsulation layer further covers the third surface.

12. The photoelectric device package of claim 8, further comprise a reflective layer disposed on the first encapsulation layer and covering the third surface.

13. The photoelectric device package of claim 1, wherein the number of the at least one photoelectric device is plural, the first encapsulation layer comprises a plurality of first encapsulation portions separated from each other, and each of the plurality of first encapsulation portions encapsulates the corresponding ones of the plurality of photoelectric devices.

14. The photoelectric device package of claim 1, wherein the number of the at least one photoelectric device is plural, and the first encapsulation layer further covers the photoelectric devices.

15. The photoelectric device package of claim 1, further comprising a second encapsulation layer on the carrier structure and at least laterally covering the first encapsulation layer, wherein the Young's modulus of the first encapsulation layer is greater than the Young's modulus of the second encapsulation layer.

16. The photoelectric device package of claim 15, wherein the second encapsulation layer further covers the first encapsulation layer.

17. The photoelectric device package of claim 1, further comprising a second encapsulation layer disposed on the carrier structure and contacting the elastic layer, wherein the Young's modulus of the first encapsulation layer is greater than the Young's modulus of the second encapsulation layer.

18. The photoelectric device package of claim 1, further comprising a second substrate, wherein the first circuit layer, the carrier structure, the second circuit layer, the at least one photoelectric device and the first encapsulation layer are located between the first substrate and the second substrate.

19. The photoelectric device package of claim 1, wherein the carrier structure further comprises at least one active device, the at least one active device comprises a source, a drain and a gate, and the drain is electrically connected to the first circuit layer.

20. The photoelectric device package of claim 19, further comprising at least one scan line and at least one data line, wherein the at least one scan line is electrically connected to the gate, and the at least one data line is electrically connected to the source.

* * * * *